(12) United States Patent
Iwasaki

(10) Patent No.: US 7,907,451 B2
(45) Date of Patent: Mar. 15, 2011

(54) SEMICONDUCTOR STORAGE DEVICE AND METHOD OF MANUFACTURING SAME

(75) Inventor: Hiroshi Iwasaki, Osaka (JP)

(73) Assignees: Empire Technology Development LLC, Wilmington, DE (US); Glitter Technology LLP, Singapore (SG)

( * ) Notice: Subject to any disclaimer, the term of this patent is extended or adjusted under 35 U.S.C. 154(b) by 0 days.

(21) Appl. No.: 12/665,320

(22) PCT Filed: Dec. 8, 2008

(86) PCT No.: PCT/JP2008/072248
§ 371 (c)(1),
(2), (4) Date: Apr. 8, 2010

(87) PCT Pub. No.: WO2010/067407
PCT Pub. Date: Jun. 17, 2010

(65) Prior Publication Data
US 2010/0296341 A1    Nov. 25, 2010

(51) Int. Cl.
*G11C 11/34* (2006.01)
(52) U.S. Cl. .......... 365/185.18; 365/185.26; 365/185.01
(58) Field of Classification Search ............ 365/185.18, 365/185.26, 185.01, 185.05
See application file for complete search history.

(56) References Cited

U.S. PATENT DOCUMENTS

| | | | |
|---|---|---|---|
| 4,513,397 A | 4/1985 | Ipri et al. | |
| 5,668,757 A * | 9/1997 | Jeng | 365/185.18 |
| 6,275,419 B1 * | 8/2001 | Guterman et al. | 365/185.26 |
| 6,888,755 B2 * | 5/2005 | Harari | 365/185.18 |
| 2005/0201187 A1 | 9/2005 | Hofmann et al. | |

FOREIGN PATENT DOCUMENTS

| | | |
|---|---|---|
| JP | 56-134776 | 10/1981 |
| JP | 57-087163 | 5/1982 |
| JP | 1421951 | 1/1988 |
| JP | 63-181380 | 7/1988 |
| JP | 03-123083 | 5/1991 |
| JP | 07-106448 | 4/1995 |
| JP | 11-087541 | 3/1999 |
| JP | 2000-299395 | 10/2000 |

(Continued)

OTHER PUBLICATIONS

Notice of Reasons for Rejection received for Japanese Application No. 2009-516768, dated Jun. 16, 2009 (with English translation).

(Continued)

*Primary Examiner* — Huan Hoang
(74) *Attorney, Agent, or Firm* — Foley & Lardner LLP

(57) ABSTRACT

The disclosure of this application enhances the data writing speed of an electrically erasable and writable semiconductor memory. In a semiconductor storage device of this application, at a time of writing data, when a positive voltage lower than a voltage at control gate 30 is applied to potential control gate 28 formed inside tunnel oxide film 360 between p channel 22 of a transistor and floating gate 32, a potential barrier between p channel 22 of the transistor and floating gate 32 is lowered, and a time required for storing an electron in floating gate 30 is reduced. After data is stored, when 0 V or a negative voltage is applied to the potential control gate, a potential barrier for an electron moving from the floating gate to the channel of the transistor increases, thereby preventing erasure of data.

12 Claims, 16 Drawing Sheets

FOREIGN PATENT DOCUMENTS

| JP | 2005-519472 | 6/2005 |
|---|---|---|
| JP | 2007-005380 | 1/2007 |
| JP | 2007-250974 | 9/2007 |

OTHER PUBLICATIONS

Notice of Reasons for Rejection received for Japanese Application No. 2009-516768, dated Nov. 10, 2009 (with English translation).

International Search Report for PCT/JP2008/072248 mailed Mar. 10, 2009 (English translation not readily available).

Iwasaki, Hiroshi et al., "Electron Tunneling through $SiO_2$/Si Structures in Scanning Tunneling Microscopy," *Jpn. J. Appl. Phys.*, vol. 40, Part 1, No. 8, Aug. 2001, pp. 5116-5120.

Iwasaki, Hiroshi et al., "Electron Tunneling through an $Al_2O_3$ Thin Film on NiAl(110) in Scanning Tunneling Microscopy," *Jpn. J. Appl. Phys.*, vol. 41, Part 1, No. 12, Dec. 2002, pp. 7496-7500.

Kim, Shieun et al., "Robust Multi-bit Programmable Flash Memory Using a Resonant Tunnel Barrier," *IEEE*, 2005, 4 pages.

VLSI Report: AG-AND-Type Flash EEPROM Cell Writing Time Shortened to 1/20 (http://techon.nikkeibp.co.jp/article/NEWS/20050617/105890/), 1 page (with English translation).

\* cited by examiner

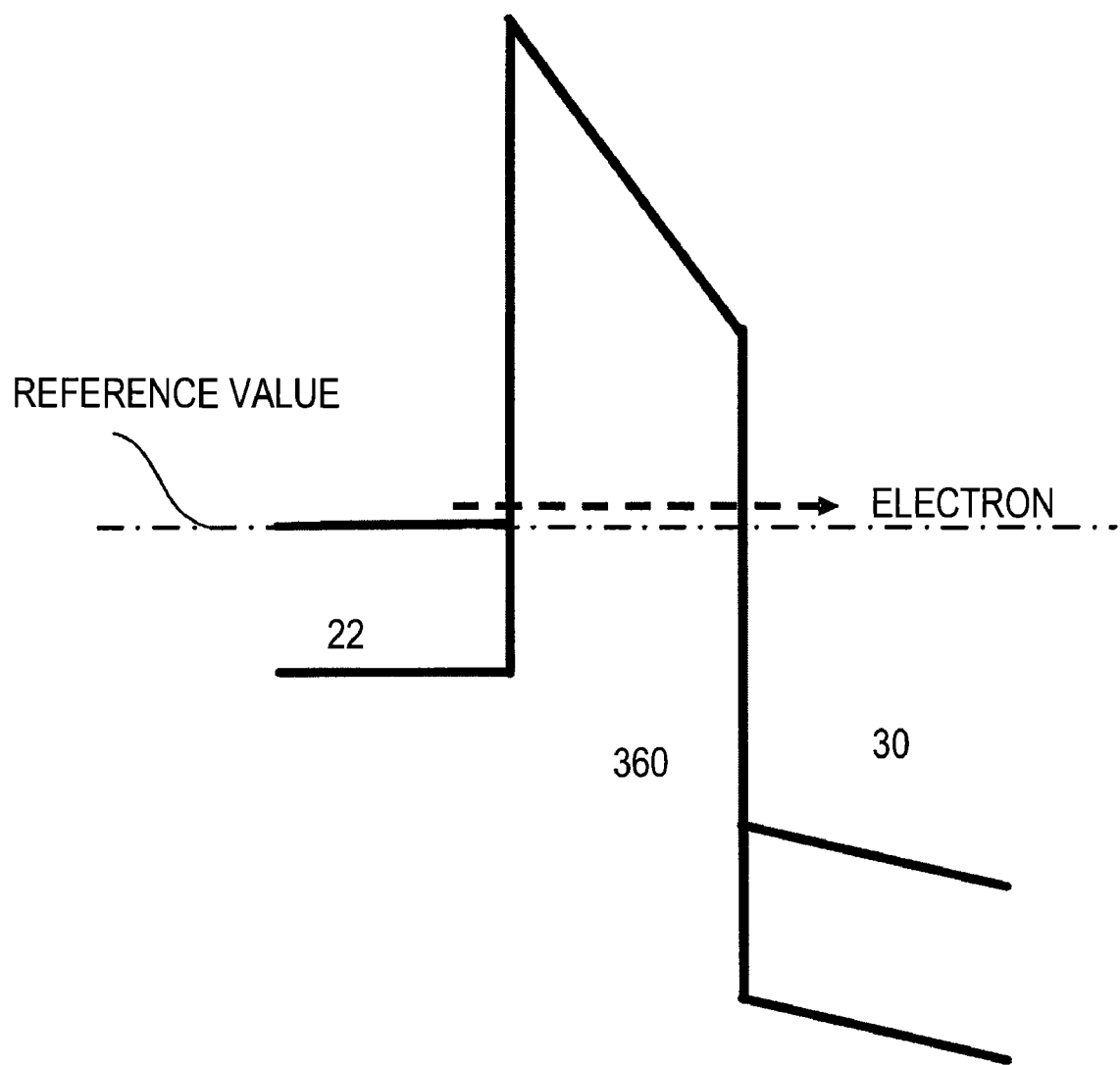

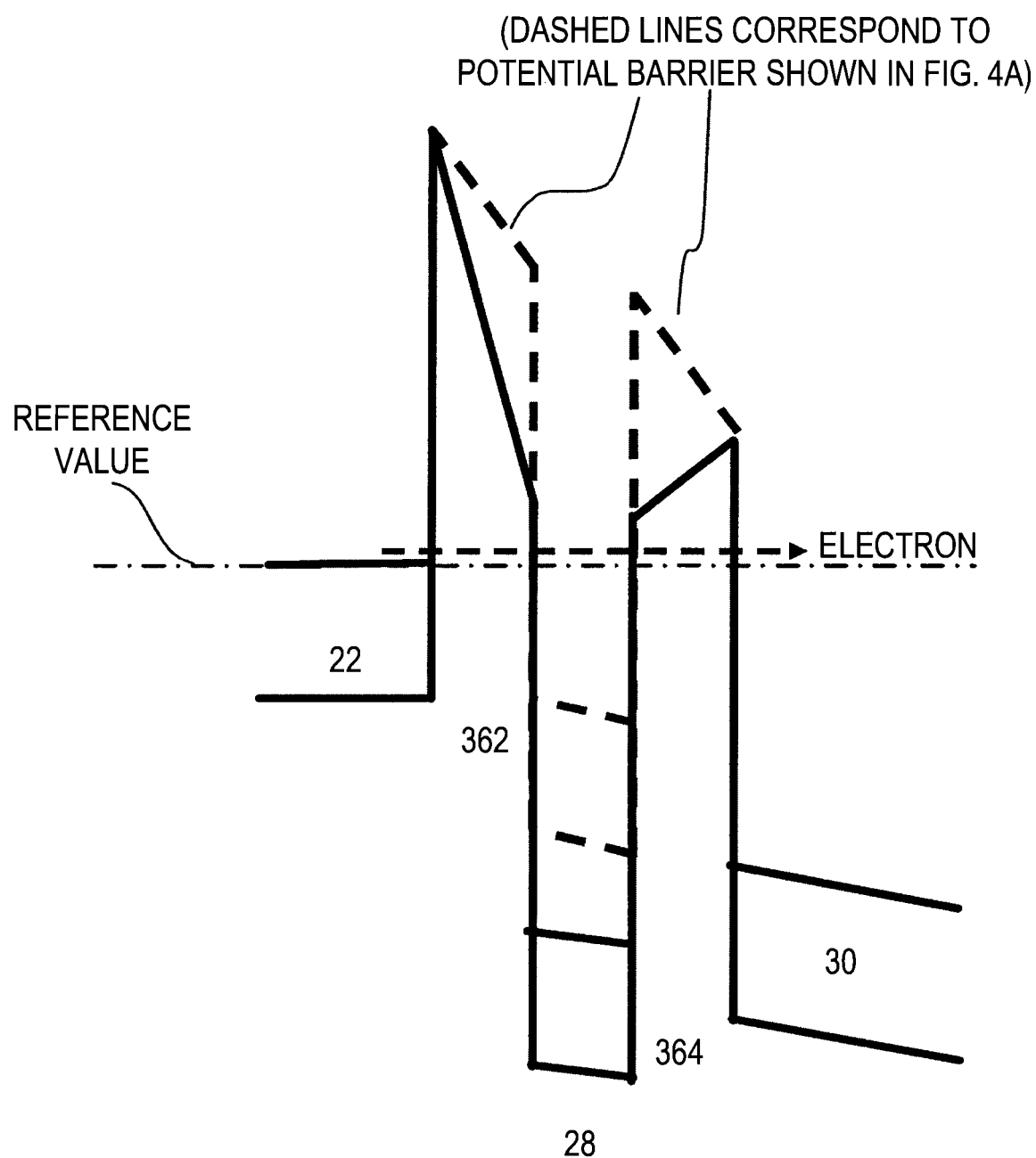

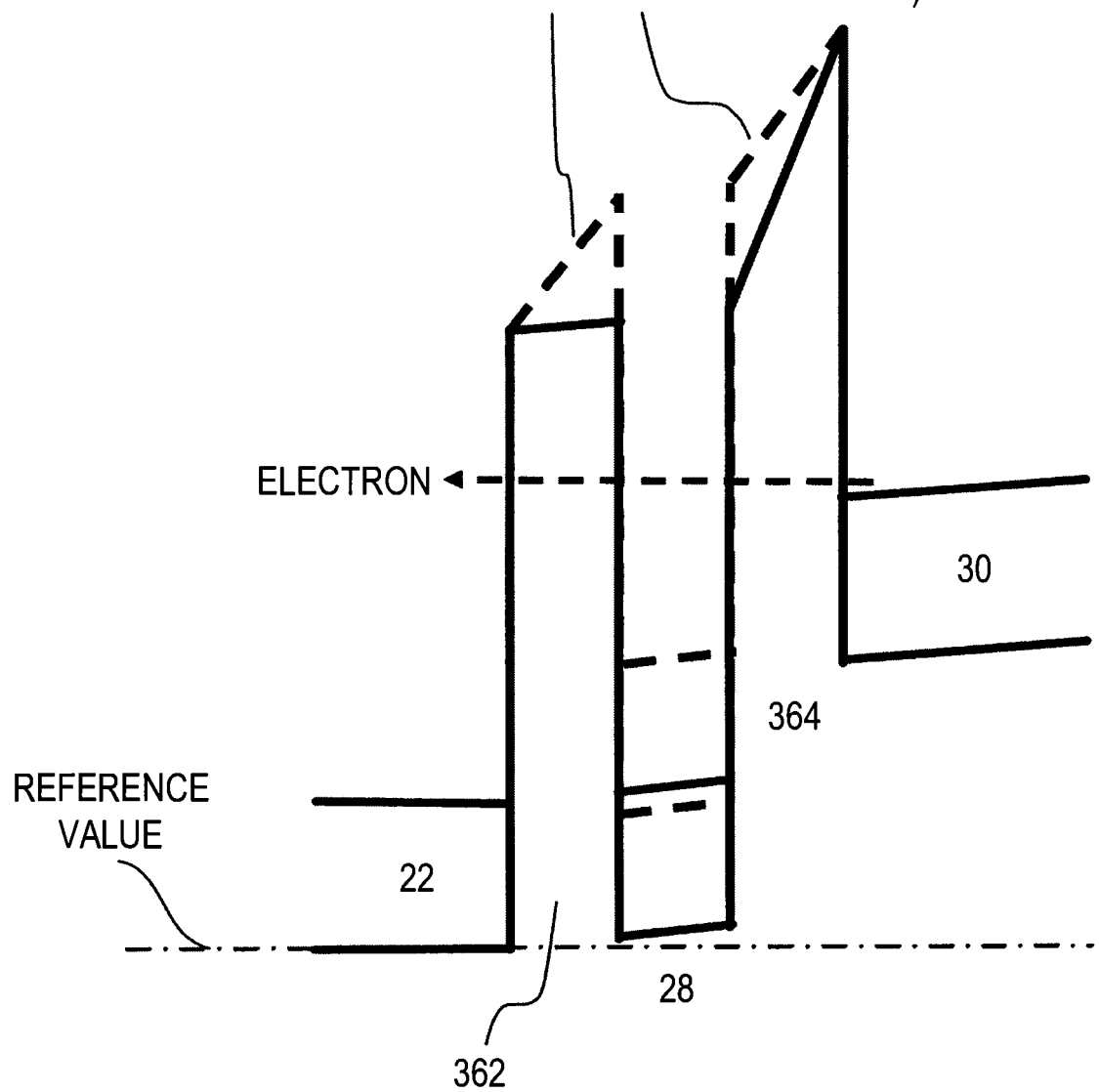

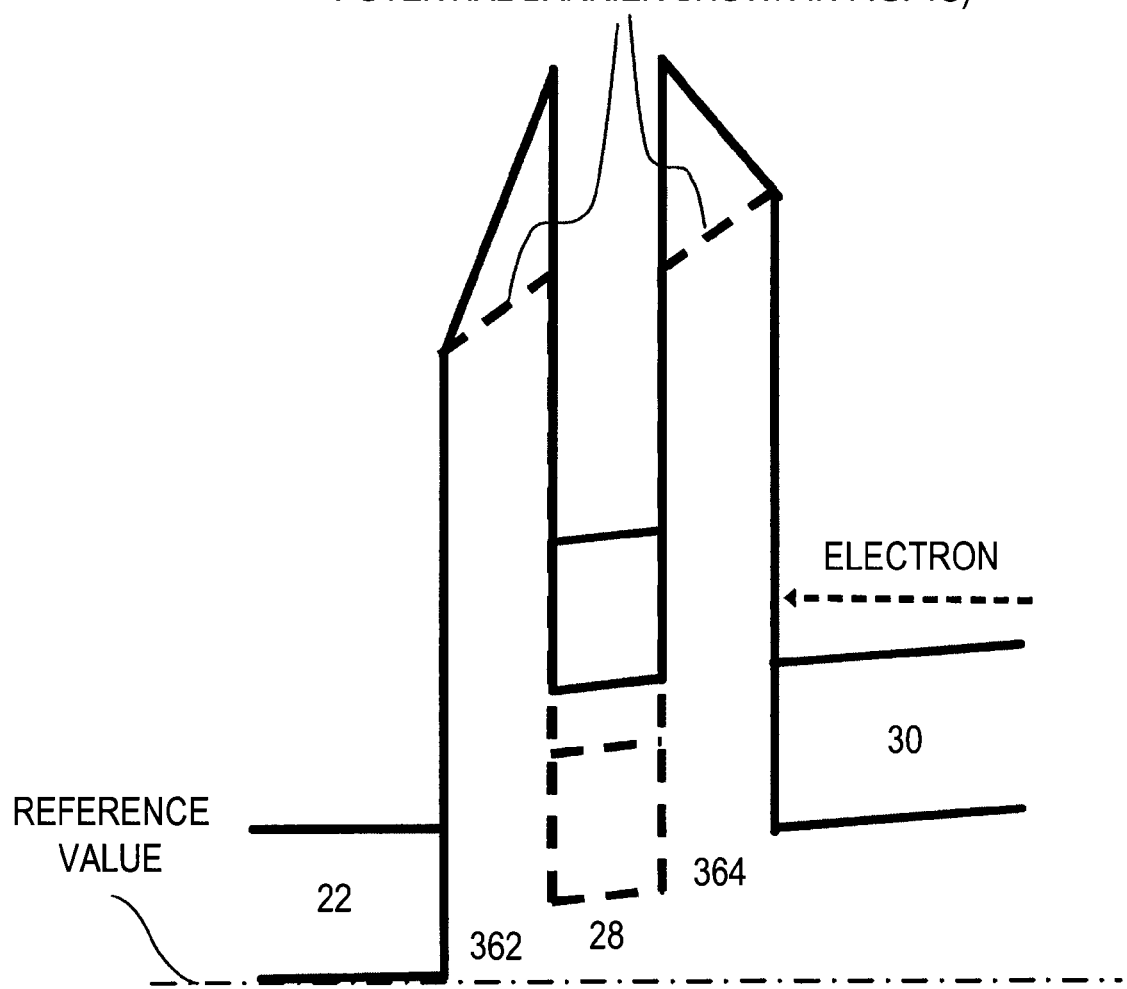

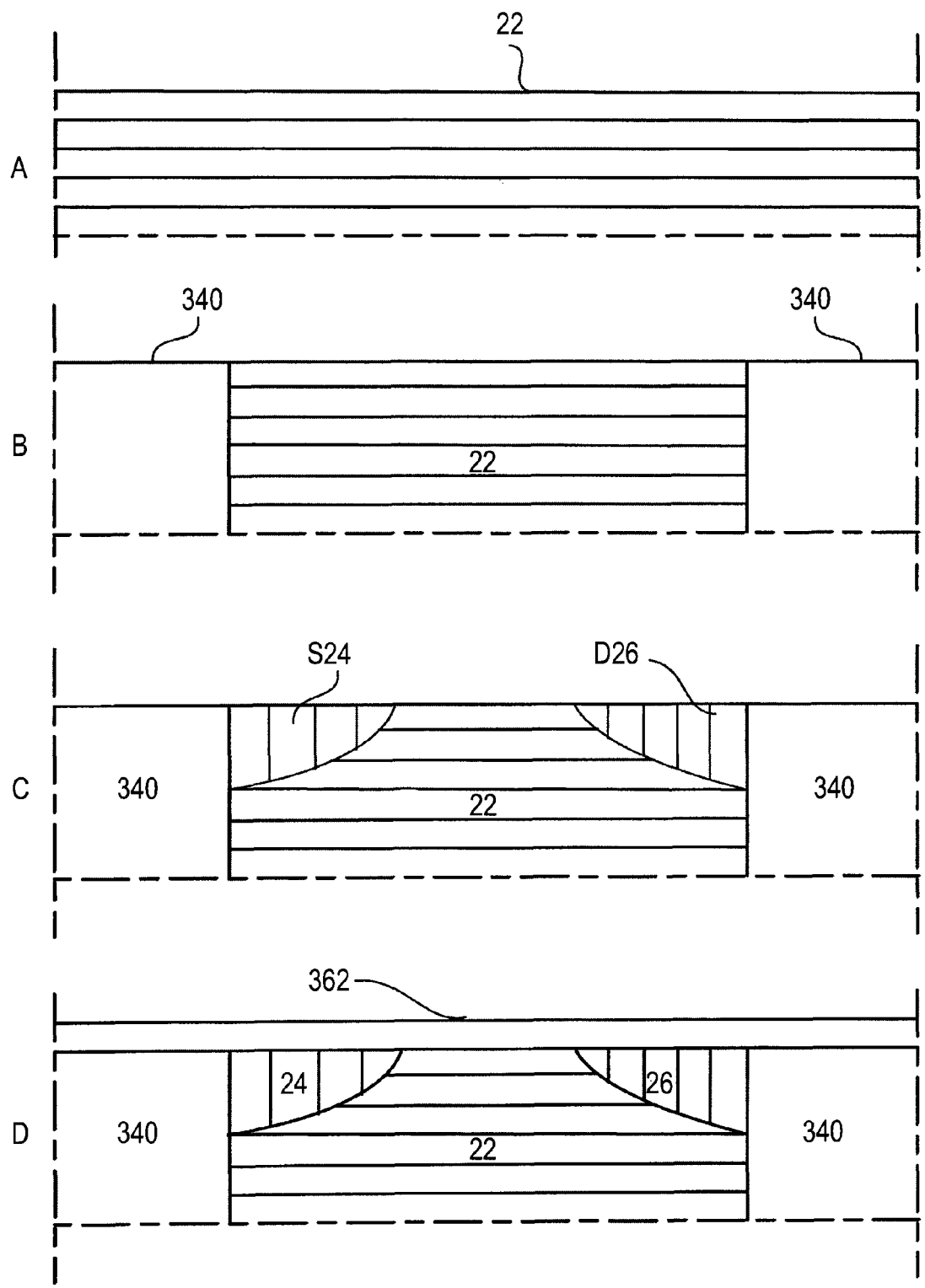

FIG. 6C
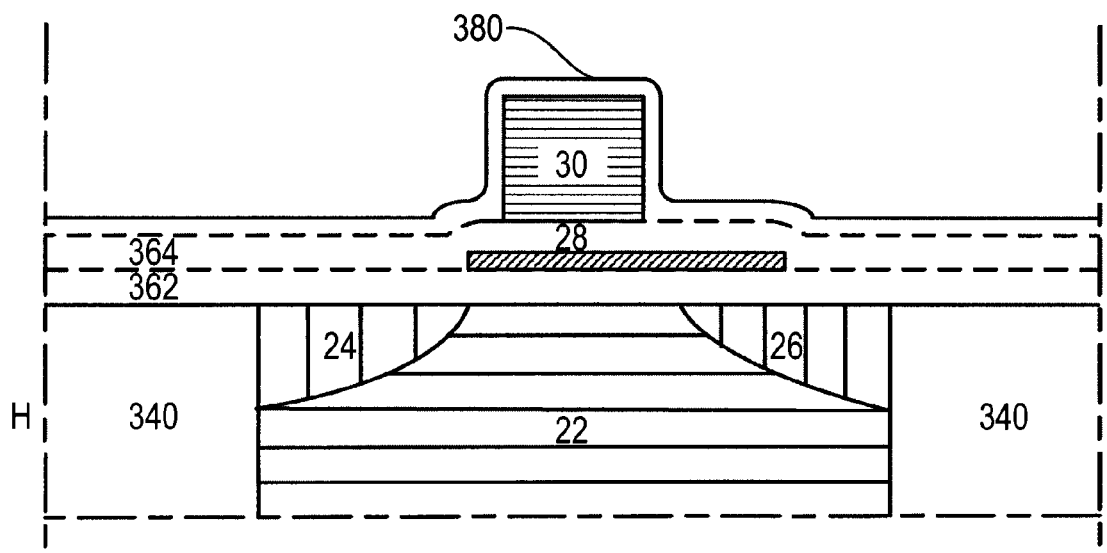
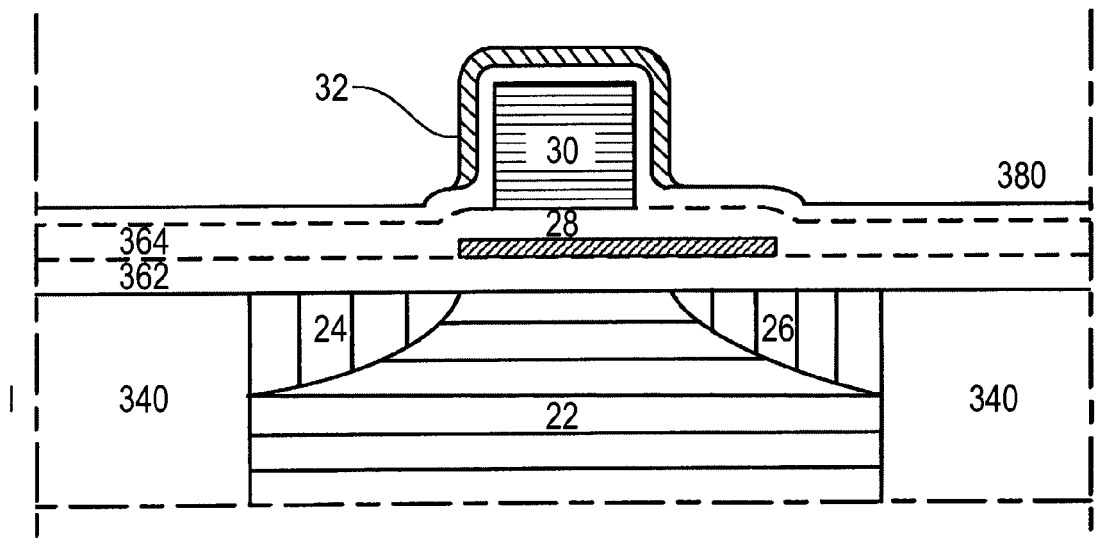

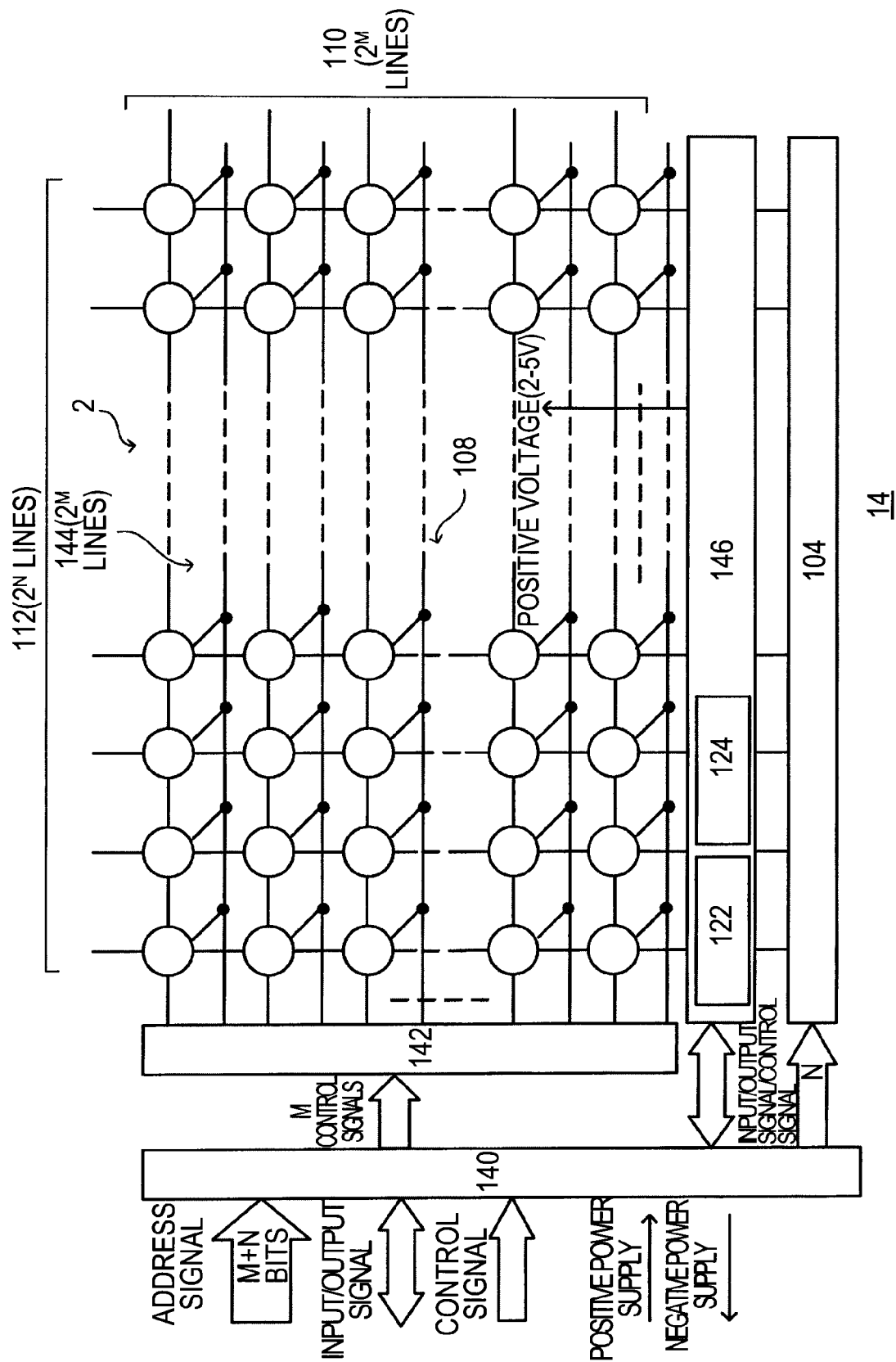

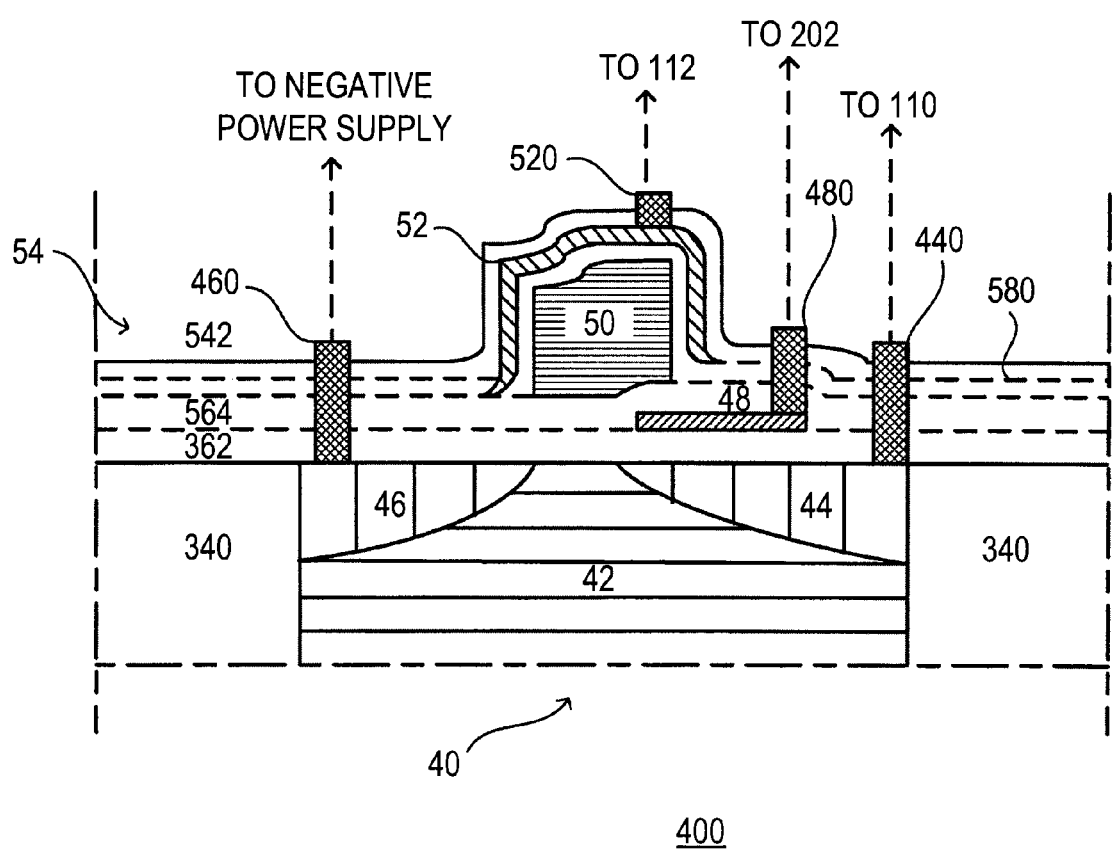

SEMICONDUCTOR STORAGE DEVICE AND METHOD OF MANUFACTURING SAME

CROSS-REFERENCE TO RELATED APPLICATIONS

The present application is a U.S. national stage application claiming the benefit of International Application No. PCT/JP2008/072248, filed on Dec. 8, 2008, the entire contents of which is incorporated herein by reference in its entirety.

TECHNICAL FIELD

The present disclosure relates to a semiconductor storage device that can electrically write and erase data, and a method of manufacturing the semiconductor storage device.

BACKGROUND ART

A nonvolatile semiconductor storage device is disclosed, for example, in Patent Documents 1 to 4, respectively.

Non-Patent Document 1 discloses a flash EEPROM (Electrically Erasable Programmable Read Only Memory) which improves a writing speed by making a source electrode of a memory cell a negative voltage when writing.

Non-Patent Documents 2 and 3 disclose movement of electrons by a tunneling effect through an insulator film in a programmable flash memory.

Further, Non-Patent Document 4 discloses a programmable flash memory that utilizes a resonant tunneling effect in which a silicon layer is inserted into an oxide film.

[Patent Document 1] Japanese Patent Laid-Open No. 2000-299395
[Patent Document 2] Japanese Patent Publication No. 2005-519472
[Patent Document 3] Japanese Patent Laid-Open No. 2007-5380
[Patent Document 4] Japanese Patent No. 1421951
[Non-Patent Document 1] [VLSI Report] AG-AND-Type Flash EEPROM Cell Writing Time Shortened to ½₀ (http://techon.nikkeibp.co.jp/article/NEWS/20050617/105890/)
[Non-Patent Document 2] "Electron Tunneling Through an Al2O3 Thin Film on NiAl(110) in Scanning Tunneling Microscopy", Hiroshi IWASAKI and Koichi SUDOH, Jpn. J. Appl. Phys. Vol. 41 (2002) pp. 7496-7500, Part 1, No. 12, December 2002
[Non-Patent Document 3] "Electron Tunneling through SiO2/Si Structures in Scanning Tunneling Microscopy", Hiroshi IWASAKI, Masahide GOTOH and Koichi SUDOH, Jpn. J. Appl. Phys. Vol. 40 (2001) pp. 5116-5120, Part 1, No. 8, August 2001
[Non-Patent Document 4] "Robust Multi-bit Programmable Flash Memory Using a Resonant Tunnel Barrier", Shieun Klm, Seung Jae Baik, Zongliang Huo, Young-Jin Noh, Chulsung Kirm, Jeong Hee Han, In-Seok Yeo, U-In Chung, Joo Tae Moon and Byung-II Ryu, 0-7803-9269-8/05, 2005 IEEE

DISCLOSURE OF THE INVENTION

Means for Solving the Problems

A semiconductor storage device according to this application has been made in view of the above described background, and one embodiment thereof is a semiconductor storage device that includes a plurality of memory cells, wherein each of the plurality of memory cells includes: a semiconductor channel of a predetermined polarity, a first region formed by a semiconductor of an opposite polarity to the channel, a second region formed by a semiconductor of an opposite polarity to the channel, a first control gate, a first insulator formed between the channel and the first gate, a floating gate, a second insulator formed between the first control gate and the floating gate, a second control gate, and a third insulator formed between the floating gate and the second control gate; wherein when a write voltage of a voltage that is determined according to a polarity of the channel is applied to the second control gate, the first insulator and the second insulator cause a charge to be stored in the floating gate, and a potential control voltage that changes a potential barrier for a charge that passes through the first insulator and the second insulator is applied to the first control gate.

An embodiment of a semiconductor device manufacture method according to this application is a method that manufactures a semiconductor storage device, comprising: forming a semiconductor channel; forming a first insulator on a surface of the channel; forming a first control gate at which an applied voltage can be changed on a surface of the first insulator; forming a second insulator on a surface of the first control gate; forming a floating gate; forming a third insulator on a surface of the floating gate; forming a second control gate on a surface of the third insulator; and applying voltages of a predetermined plurality of values to the first control gate, or forming wiring for placing the first control gate in a floating state in which the first control gate is electrically isolated from all other components.

SUMMARY

One embodiment of a semiconductor storage device according to this application is a so-called EEPROM that has a plurality of memory cells, wherein each of the plurality of memory cells comprises, on a p-type semiconductor channel of a transistor, a potential control gate formed via a first insulator, a floating gate formed via a second insulator on the potential control gate, and a read/write control gate (R/W control gate) formed via a third insulator on the floating gate.

Each of these memory cells stores data of one bit in accordance with whether or not a negative charge (electron) is stored in the floating gate.

When storing data in respective memory cells in which a charge has not been accumulated, a positive voltage (for example, a positive power supply voltage) is applied to the R/W control gate, a voltage which is the same as that at the R/W control gate is applied to the potential control gate, and when an electron is present in the channel of the transistor, the electron passes through the insulator and the potential control gate because of a tunneling effect and is stored in the floating gate.

When writing data, when a positive voltage that is the same as or less than that at the R/W control gate is applied to the potential control gate, a potential barrier for an electron between the channel of the transistor and the floating gate becomes low, and hence a time required for storing an electron in the floating gate is shortened.

When erasing data (erasing a charge) of respective memory cells in which a charge is stored, a negative voltage (for example, a negative power supply voltage) is applied to the R/W control gate, a positive voltage of the same level as at a channel 22 (for example, 5 V when the positive power supply voltage is 5 V) is applied to the potential control gate, an electron passes through the insulator and the potential control gate because of a tunneling effect, the electron reaches the channel of the transistor and a charge stored in the floating gate is erased.

At the time of erasing data, when a positive voltage that is near to a voltage at channel 22 is applied to the potential control gate, a potential barrier for an electron between the floating gate and the channel of the transistor becomes low, and hence a time required for eliminating the electron of the floating gate is shortened.

After data has been stored, when a negative power supply voltage (for example, a ground voltage (0 V)) is applied to the potential control gate, a potential barrier for an electron between the channel of the transistor and the floating gate increases, and hence loss of data caused by leakage of an electron to the channel of the transistor from the floating gate is prevented.

Further, after data has been stored, when a low negative voltage of a level of −1 V or below is applied to the potential control gate, a potential barrier for an electron between the channel of the transistor and the floating gate increases further. Hence, compared to a case in which 0 V is applied to the potential control gate, loss of data caused by leakage of an electron to the channel of the transistor from the floating gate is prevented to a greater degree.

Furthermore, when a p-type semiconductor is used for the potential control gate, after data is stored, even if the voltage of the potential control gate is 0 V, since the potential barrier increases when an electron moves from the floating gate to the channel of the transistor, similarly to when a negative voltage is applied, loss of data is prevented to an even greater degree.

In this connection, by performing appropriate changes, a configuration can be adopted for the above described memory cells so that a floating gate acquires and stores a charge from any arbitrary member of the group consisting of the channel, the source, and the drain of the transistor.

The technical advantages of the disclosure relating to the claims of this application and other technical advantages will be understood by those skilled in the art by reading the detailed description of the embodiments as illustrated in the drawings.

The attached drawings are included in the specification of this application and form a part thereof. The drawings illustrate embodiments of the disclosure relating to the claims of this application and, together with the description, serve to describe the principles of the present disclosure.

It is to be understood that, unless specifically expressed otherwise, the drawings referred to in the specification of this application are not drawn to a fixed scale.

BRIEF DESCRIPTION OF THE DRAWINGS

Embodiments of the disclosure relating to the claims of this application will be best understood by referring to the following description along with the drawings that relate to the configuration and operation thereof.

FIG. 4A is a potential diagram that explains changes in a potential barrier for an electron of each component part of a memory cell in a case where there is no potential control gate with respect to a memory cell of the memory circuit shown in FIG. 2 and FIG. 3, which is a potential diagram in a case of storing an electron in a floating gate to write data;

FIG. 5A is a view that explains control of a potential barrier inside a tunnel oxide film and a floating gate for an electron produced by a potential control gate with respect to a memory cell of the memory circuit shown in FIG. 2 and FIG. 3, which is a potential diagram in a case of storing an electron in a floating gate to write data;

FIG. 5B is a view that explains control of a potential barrier inside a tunnel oxide film and a floating gate for an electron produced by a potential control gate with respect to a memory cell of the memory circuit shown in FIG. 2 and FIG. 3, which is a potential diagram in a case of removing an electron that is stored in a floating gate to erase data;

FIG. 5C is a view that explains control of a potential barrier inside a tunnel oxide film and a floating gate for an electron produced by a potential control gate with respect to a memory cell of the memory circuit shown in FIG. 2 and FIG. 3, which is a potential diagram in a case of retaining an electron that is stored in a floating gate 30;

FIG. 6A is a first view that illustrates a method of manufacturing a memory cell shown in FIG. 2 and FIG. 3 and the like, in which reference characters (A) to (D) denote a first to fourth stage of a memory cell manufacturing process;

FIG. 6C is a third view that illustrates a method of manufacturing a memory cell shown in FIG. 2 and FIG. 3 and the like, in which reference characters (H) and (I) denote an eighth and ninth stage of a memory cell manufacturing process;

FIG. 8 is a view that illustrates the configuration of a third EEPROM that is explained as a third embodiment of the semiconductor storage device according to this application; and FIG. 9 is a view that illustrates the configuration of a second memory cell that is explained as a fourth embodiment of the semiconductor storage device according to this application.

BEST MODE FOR CARRYING OUT THE INVENTION

Hereunder, embodiments of the disclosure relating to the claims of this application are described in detail.

The embodiments of the disclosure relating to the claims of this application are illustrated by way of example in the attached drawings.

Although the disclosure relating to the claims of this application will now be described in relation to the embodiments, it will be understood by those skilled in the art that the embodiments are not intended to limit the disclosure relating to the claims of this application to the precise embodiments disclosed.

On the contrary, the disclosure relating to the claims of this application is intended to encompass alternatives, modifications, and equivalents that may be included within the spirit and scope of the disclosure as defined by the claims of this application.

The description of the disclosure relating to the claims of this application is set forth in specific form and in detail in order to provide a thorough understanding of the disclosure relating to the claims of this application.

However, it will be evident to those skilled in the art that the disclosure relating to the claims of this application may be implemented without using all of these specific details.

In other instances, well known methods, procedures, components, and circuits have not been described in detail so as not to unnecessarily obscure aspects of the present disclosure.

It should be kept in mind, however, that all of these and similar terms should be associated with appropriate physical quantities, and that these terms are merely convenient labels that are applied to these quantities.

[Configuration of First EEPROM 10]

Figure 1:
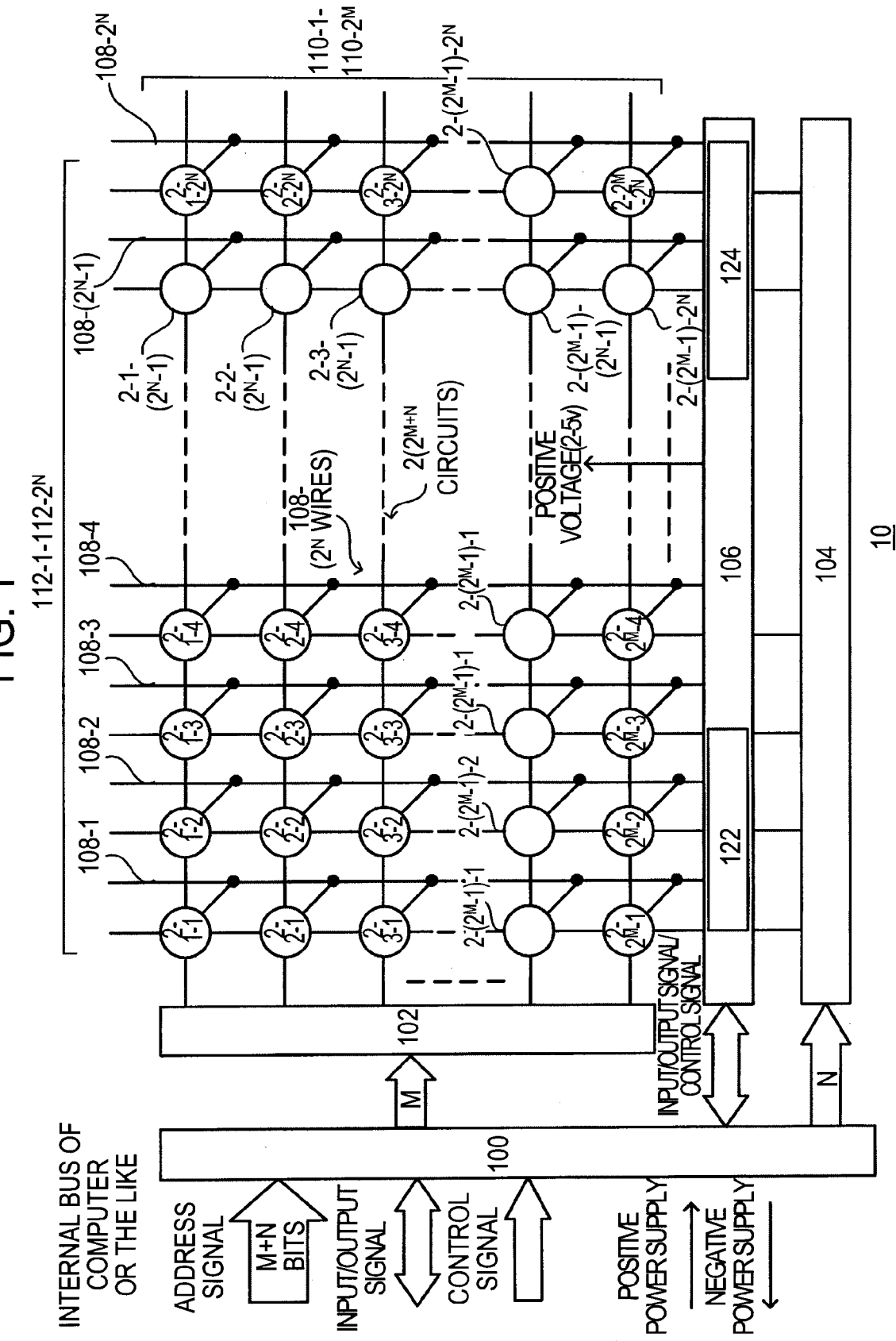
FIG. 1 is a view that illustrates the overall configuration of a first EEPROM that is explained as a first embodiment of the semiconductor storage device according to this application.

FIG. 1 is a view that illustrates the overall configuration of a first EEPROM 10 that is explained as a first embodiment of a semiconductor storage device according to this application.

Figure 2:
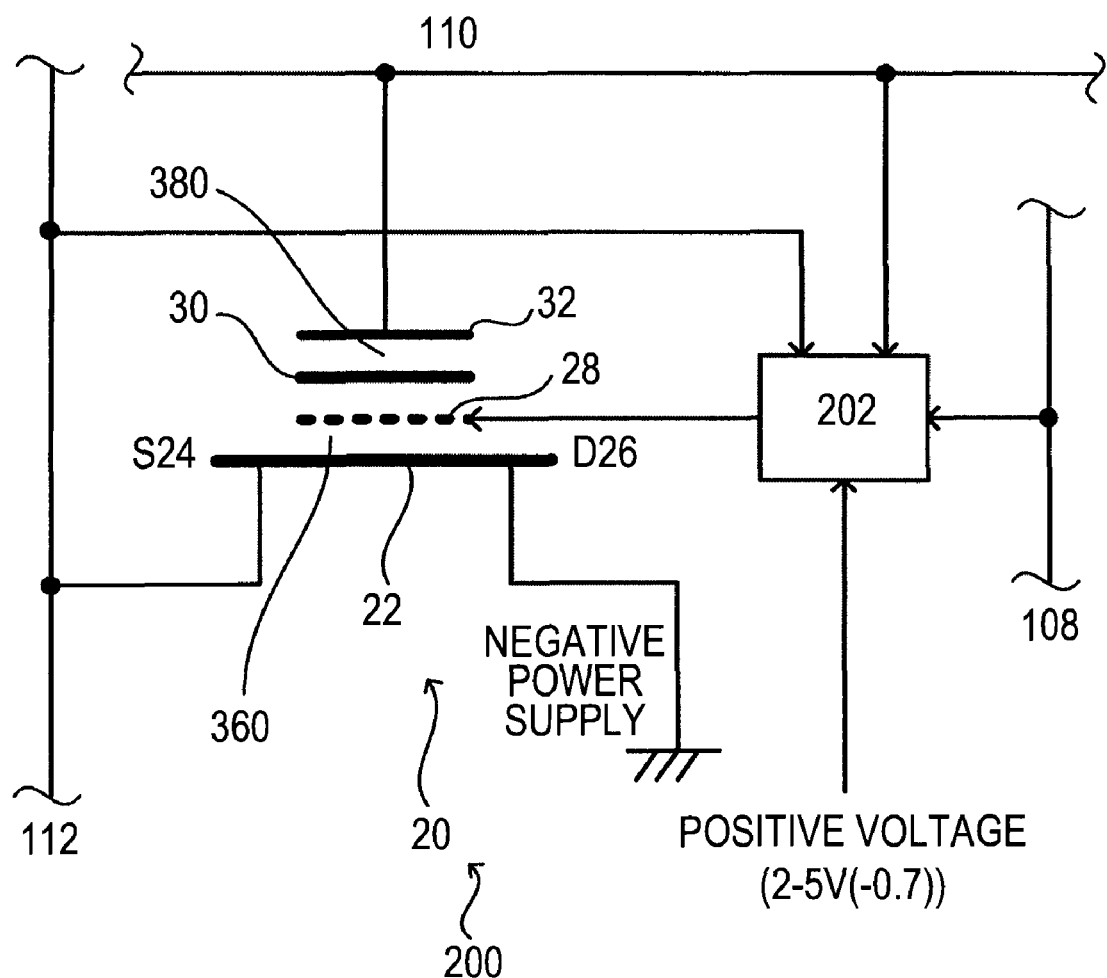
FIG. 2 is a view that illustrates a memory circuit shown in FIG. 1.

FIG. 2 is a view that illustrates a memory circuit 2 shown in FIG. 1.

Figure 3:
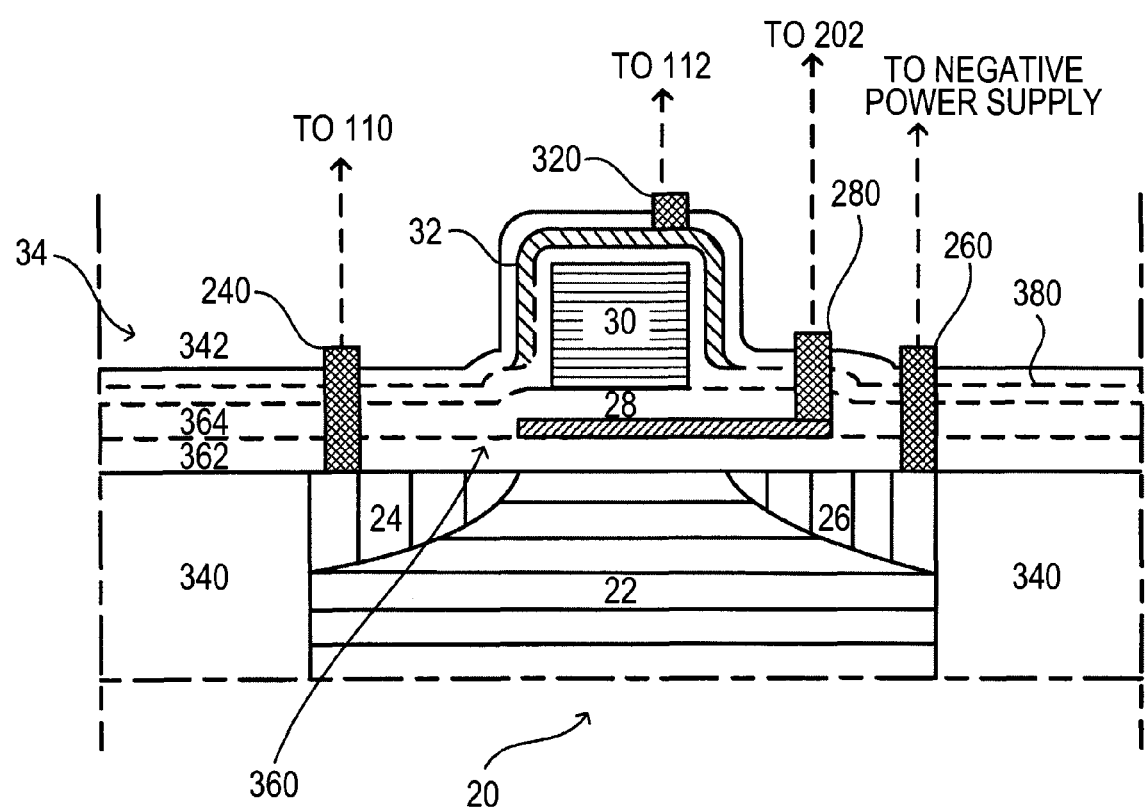
FIG. 3 is a view that illustrates by way of example a cross section of a memory cell shown in FIG. 2.

FIG. 3 is a view that illustrates by way of example a cross section of a first memory cell 200 shown in FIG. 2.

As shown in FIG. 1, the EEPROM 10 is composed by an input/output (I/O) interface circuit 100, a row decoder 102, a column decoder 104, an input/output control circuit 106, potential control wires 108-1 to 108-$2^N$, $2^M$ word lines 110-1 to 110-$2^M$, $2^N$ bit lines 112-1 to 112-$2^N$, and $2^{M+N}$ memory circuits 2-1-1 to 2-$2^M$-$2^N$. The EEPROM 10 is connected to a positive power supply (for example, a +side power supply for when the EEPROM 10 operates with a single power supply of a positive voltage) and a negative power supply (for example, similarly, a power supply of ground voltage (0 V)) for operation.

The input/output control circuit 106 includes a signal readout circuit 122 and a potential control circuit 124.

In the following description, it should be understood that a voltage of a positive power supply and a negative power supply corresponding to logical values 1 and 0 applied to an R/W control gate 32 and the like and a voltage applied to a potential control gate 28 include voltages of a range whereby the EEPROM 10 and component parts thereof can operate normally.

Further, M and N are integers that are equal to or greater than 2, and M+N represents the number of address lines input to the EEPROM 10.

Furthermore, hereunder, when a description is made without specifying a particular component part of multiple component parts, such as potential control wires 108-1 to 108-$2^N$ or the like, the description may be abbreviated to simply potential control wire 108 or the like.

[Configuration and Arrangement of Memory Circuits 2]

As shown in FIG. 1, in the EEPROM 10 the memory circuits 2 are logically arrayed in a matrix form composed by $2^M$ rows×$2^N$ columns. A potential control wire 108, a word line 110 in the row direction and a bit line 112 in the column direction are connected to each memory circuit 2.

As shown in FIG. 2, the memory circuit 2 includes a first memory cell 200 and a voltage application circuit 202.

As shown in FIG. 3, the memory cell 200 includes an enhancement type field effect transistor (first transistor) 20, a potential control gate 28, a first floating gate 30, a first R/W control gate 32, and a first oxide film layer 34 that includes a tunnel oxide film 360, a first R/W control gate oxide film 380, inter-element isolation regions 340, and a first oxide film 342.

The transistor 20 is composed by a p-type semiconductor channel 22, and a source (S) 24 and a drain (D) 26 formed as regions of an n-type semiconductor at the two ends of the channel 22. The source 24 is connected to the bit line 112 and the drain 26 is connected to the negative power supply.

In FIG. 2, a case in which the voltage application circuit 202 is provided in each memory circuit 2 is shown as a specific example.

However, the voltage application circuit 202 need not necessarily be provided in each memory circuit 2. For example, the voltage application circuit 202 may be provided for each word line 110 corresponding to a data word read out from the EEPROM 10, or may be concentratively provided inside the input/output control circuit 106.

[Each Component Part of EEPROM 10]

In the EEPROM 10 (FIG. 1), for example, the input/output interface circuit 100 is connected to a bus (not shown) of a device such as a removable storage medium, a wired communication device, a mobile communication device, a PDA (Personal Digital Assistant), or a computer. The input/output interface circuit 100 accepts M+N address signals input from the bus. Of these signals, the input/output interface circuit 100 outputs M signals to the row decoder 102, and outputs the other N signals to the column decoder 104.

Further, the input/output interface circuit 100 accepts control signals input from the bus that are used for control such as writing data to the EEPROM 10 and reading out data from the EEPROM 10, and outputs the control signals to the input/output control circuit 106.

TABLE 1

| Signal line/memory cell 200 component | Operation | | | |
| --- | --- | --- | --- | --- |
| | Data write | Data erase | Data read | Data retention |
| Potential control wire 108 | Positive power supply voltage (5 V) | Positive power supply voltage (5 V) | Positive power supply voltage (5 V) | Negative power supply voltage (0 V) |
| Word line 110/ Source 24 | Positive or negative power supply voltage (5 V/0 V) corresponding to data | Positive power supply voltage (5 V) | Positive power supply voltage (5 V) | Don't Care |

TABLE 1-continued

| Signal line/memory cell 200 component | Operation | | | |
|---|---|---|---|---|
| | Data write | Data erase | Data read | Data retention |
| Bit line 112/ R/W control gate 32 | Positive power supply voltage (5 V: Voltage of R/W control signal for write) | Negative power supply voltage (0 V) | Positive power supply voltage (5 V) | Negative power supply voltage (0 V) |
| Potential control gate 28 (Voltage application circuit 40 output) | Positive voltage (= Positive power supply voltage 5 V) | Positive power supply (= Positive power supply voltage) | Floating state | Negative power supply voltage (0 V) |

Table 1 shows voltages applied to each component of the memory circuit shown in FIG. 2 and the like by the column decoder 104 and the input/output control circuit 106 shown in FIG. 1, as well as voltage values that the voltage application circuit applies to a potential control gate of the memory cell.

As shown in Table 1, the row decoder 102 decodes M address signals that are input from the input/output interface circuit 100, selects and activates any one of the word lines 110 (for example, makes the word line a positive power supply voltage corresponding to logical value 1), deactivates the other word lines 110 (for example, makes the word lines a negative power supply voltage corresponding to logical value 0), and outputs a signal as a R/W control signal to the voltage application circuit 202 and the R/W control gate 32 of the memory cell 200.

The voltage of the R/W control signal applied from the row decoder 102 to the R/W control gate 32 when writing data is set to a lower voltage than the voltage of a signal of the same kind in a common EEPROM.

For example, in a common EEPROM the voltage of an R/W control signal when writing data is a level of around 10 V that is higher than the positive power supply voltage. In the EEPROM 10, it is possible to make the voltage of the R/W control signal when writing data a positive voltage lower than the aforementioned voltage because of the presence of the potential control gate 28.

In the following description, in order to give a specific form to and clarify the embodiment, a R/W control signal when writing data is taken as a voltage that corresponds to logical value 1 in the EEPROM 10, that is, a positive power supply voltage (for example, 5 V), and a R/W control signal at other times is taken as logical value 0, that is, a negative power supply voltage.

In this connection, in the following description, a case in which the term "negative power supply voltage" denotes a "ground voltage (0 V)" in a common semiconductor device is taken as a specific example.

The column decoder 104 decodes N address signals input from the input/output interface circuit 100, selects and activates any one of the bit lines 112, deactivates the other bit lines 112, and applies a signal to the input/output control circuit 106.

As shown in Table 1, when a control signal for writing data input from the bus has been activated (at a time of data writing), the input/output control circuit 106 applies a positive power supply voltage or a negative power supply voltage indicated by the value of a data bit input from the bus to the source 24 of the memory cell 200 through the bit line 112 selected by the column decoder 104.

Further, when writing data, the input/output control circuit 106 outputs an R/W control signal of a positive power supply voltage to the voltage application circuit 202 and the R/W control gate 32 of the memory cell 200 via the bit line 112 selected by the column decoder 104.

Furthermore, when writing data, the input/output control circuit 106 outputs a R/W control signal of a negative power supply voltage to the voltage application circuit 202 and the R/W control gate 32 of the memory cell 200 via a bit line 112 that has not been selected by the row decoder 102.

At the input/output control circuit 106, the potential control circuit 124 outputs a positive voltage to be applied to the potential control gate 28 for writing data, to the voltage application circuit 202.

For example, when writing data, this positive voltage is a voltage that is the same as or lower than (for example, around 5 V to 2 V; hereunder, a case of 5 V is exemplified) the positive power supply voltage applied to the R/W control gate 32.

Further, when retaining data, the potential control circuit 124 outputs a potential control signal of a negative power supply voltage to the voltage application circuit 202 via the potential control wire 108.

Furthermore, when writing data, the potential control circuit 124 outputs a potential control signal of a negative power supply voltage to the voltage application circuit 202 via the potential control wire 108.

Further, when a control signal for reading out data that is input from the bus is activated (when reading data), the potential control circuit 124 outputs a potential control signal of a positive power supply voltage to the voltage application circuit 202 via the potential control wire 108.

When both a control signal for reading out data input from the bus and a control signal for writing data have been deactivated (when retaining data in the memory cell 200), the potential control circuit 124 outputs a potential control signal of a negative power supply voltage to the voltage application circuit 202.

When reading out data, the signal readout circuit 122 determines whether or not an electric current flows to the memory cells 200 connected to the bit line 112 selected by the row decoder 102 and the word line 110 selected by the column decoder 104.

Further, when an electric current does not flow to the memory cells 200, the signal readout circuit 122 determines that logical value 1 is stored (an electron is not stored) in the memory circuits 2 connected to the selected bit line 112. In contrast, when an electric current does flow, the signal readout circuit 122 determines that logical value 0 is stored in these memory circuits 2 (electrons are stored).

The signal readout circuit 122 outputs the determination result to the bus via the input/output interface circuit 100 as an output signal.

[Memory Cell 200 of Memory Circuit 2]

Hereunder, the memory cell 200 of the memory circuit 2 is described.

The oxide film layer 34 of the memory cell 200 shown in FIG. 3 is formed by, for example, silicon dioxide.

In the oxide film layer 34, the inter-element isolation regions 340 electrically isolate an area between elements constituting the EEPROM 10 (for example, a plurality of adjacent memory circuits 2) as well as between constituent elements thereof. For example, the inter-element isolation regions 340 electrically isolate an area between wiring that connects the potential control gate 28 to the potential control wire 108 and wiring that connects the drain 26 to the negative power supply.

In the oxide film layer 34, the inter-element isolation regions 340 isolate areas between elements constituting the EEPROM 10.

The R/W control gate oxide film 380 electrically isolates an area between the floating gate 30 and the R/W control gate 32.

The tunnel oxide film 360 includes a first tunnel oxide film 362 and a second tunnel oxide film 364 that sandwich the potential control gate 28. In accordance with a voltage applied to the potential control gate 28 and the R/W control gate 32, the tunnel oxide film 360 allows passage of electrons by a tunneling effect or prevents passage of electrons.

When writing data, voltages as shown in Table 1 are applied to the R/W control gate 32 and the potential control gate 28.

In order to write data, these voltages are applied, and when electrons to be stored in the floating gates 30 are present in the channel 22, the tunnel oxide film 360 allows the electrons to pass from the channel 22 into the floating gates 30 in a larger quantity in a fixed period of time than in the case of a common EEPROM.

Further, when voltages for retaining data or reading out data shown in Table 1 are applied to the R/W control gate 32 and the potential control gate 28, the tunnel oxide film 360 retains the stored data by preventing movement of an electron stored in the floating gate 30 to the channel 22.

The potential control gate 28 is formed by, for example, silicon in the tunnel oxide film 360 between the channel 22 and the potential control gate 28. In accordance with a voltage of a potential control signal applied from the input/output control circuit 106, the potential control gate 28 controls a potential barrier for an electron inside the tunnel oxide film 360 as shown in FIG. 4A to FIG. 4C and FIG. 5A to FIG. 5C that are referred to and described later.

Preferably, the potential control gate 28 is formed as thin as possible in manufacture.

The thinner the potential control gate 28 is, the less hindrance there is to the passage of an electron from the channel 22 to the floating gate 30.

Moreover, even when the potential control gate 28 is formed as thin as possible, the potential control gate 28 adequately controls the potential of the tunnel oxide film 360.

The floating gate 30 is formed by, for example, polysilicon, between the potential control gate 28 and the R/W control gate oxide film 380. The floating gate 30 stores or releases an electron supplied from the channel 22 in accordance with control of the input/output control circuit 106 and the like.

In accordance with a voltage value of an R/W control signal applied from the input/output control circuit 106, the R/W control gate 32 controls storage of an electron from the channel 22 to the floating gate 30 as well as release of an electron from the floating gate 30 to the negative power supply via the channel 22 and the drain 26.

When a R/W control signal of a positive power supply voltage is applied to the R/W control gate 32 by the input/output control circuit 106 in order to store data, a potential control signal of a positive voltage is applied to the potential control gate 28 by the potential control circuit 124 of the input/output control circuit 106 via the potential control wire 108.

When a positive potential control signal is applied to the potential control gate 28, a potential barrier for an electron inside the tunnel oxide film 360 decreases and it becomes easier for an electron to pass from the channel 22 to the floating gate 30.

[Voltage Application Circuit 202]

Hereunder, the voltage application circuit 202 of the memory circuit 2 is described.

As described above referring to FIG. 2 and Table 1, the potential control wire 108, the word line 110, and the bit line 112 are input to the positive voltage power supply and the voltage application circuit 202.

As shown in Table 1, the voltage application circuit 202 applies a negative voltage power supply to the potential control gate 28 when the voltage of the potential control wire 108 and the word line 110 is a negative power supply voltage.

Further, when the voltage of the potential control wire 108 is a positive power supply voltage and the voltage of the word line 110 is a negative power supply voltage, the voltage application circuit 202 applies a positive voltage input from the input/output control circuit 106 to the potential control gate 28.

Furthermore, when the voltages of the potential control wire 108 and the word line 110 are positive power supply voltages, the voltage application circuit 202 places the potential control gate 28 in a floating state in which the potential control gate 28 is isolated from each of a positive power supply, a negative power supply, and a positive voltage for data writing.

[Writing Data to Memory Cell 200]

Hereunder, a method of writing data to the memory cell 200 is described.

When writing of data is performed, as shown in Table 1, a potential control signal of a positive voltage is applied to the potential control gate 28 by the voltage application circuit 202.

Further, when a positive power supply voltage that indicates a data bit value 1 is applied via the word line 112 to the source 24 of the memory cell 200 and an R/W control signal of a positive voltage is applied to the R/W control gate 32, an electron supplied to the channel 22 passes through the tunnel oxide film 360 and the potential control gate 28 and is stored in the floating gate 30.

In contrast, at a time when writing of data is performed, if a negative power supply voltage that indicates a data bit value 0 is applied to the source 24 and a potential control signal of a positive voltage is applied to the floating gate 30, since an electron is not supplied to the floating gate 30 from the channel 22, an electron is not stored in the floating gate 30 and a state is maintained in which an electron is not stored therein.

Thus, the storing of an electron to the floating gate 30 is controlled in accordance with a voltage applied to the source 24 via the bit line 112, a voltage applied to the potential control gate 28 by the voltage application circuit 202, and a voltage applied to the R/W control gate 32, so that data bit values are written in respective memory cells 200.

[Erasing Data]

The above described writing of data is performed in a state in which an electron is not stored in the floating gate 30 of the memory cell 200 of all the memory circuits 2.

A method that places the floating gate 30 of all memory cells 200 in a state in which an electron is not stored therein (method that erases data) is the same as a data erasing method in a common EEPROM.

For example, as shown in Table 1, erasure of data is performed by the input/output control circuit 106 making the potential control wire 108 a positive power supply voltage in all the memory cells 200, applying a negative power supply voltage to the R/W control gate 32 via the bit line 112, applying a positive voltage to the potential control gate 32, and applying a positive power supply voltage to the source 24 via the word line.

[Reading Data from Memory Cell 200]

Hereunder, a method of reading out data from the memory cell 200 is described.

When reading of data is performed, as shown in Table 1, in order not to influence reading of data from the floating gate 30, the potential control gate 28 is placed in a floating state by the voltage application circuit 202.

In a case in which a positive power supply voltage is applied to the source 24 and the R/W control gate 32 of the memory cell 200 via the word line 110 and the bit line 112, when an electron is stored in the floating gate 30, a potential barrier for an electron inside the channel 22 increases and current does not flow to the channel 22.

In contrast, when an electron is not stored in the floating gate 30, a potential barrier for an electron inside the channel 22 becomes low and current flows to the channel 22.

Thus, a data bit stored in the memory cell 200 of each memory circuit 2 is read out by the input/output control circuit 106 and the signal readout circuit 122 thereof in accordance with whether or not current flows to the memory cell 200.

[Data Retention in Memory Circuit 2]

Hereunder, a method of retaining data in the memory circuit 2 is described.

When retaining data, as shown in Table 1, in order to retain an electron in the floating gate 30 a potential control signal of a negative power supply voltage is applied to the potential control gate 28 by the voltage application circuit 202, and a negative power supply voltage is applied to the R/W control gate 32 via the bit line 110.

When a potential control signal of a negative power supply voltage is applied to the potential control gate 28, a potential barrier for an electron inside the tunnel oxide film 360 increases, and thus passage of an electron to the floating gate 30 from the channel 22 is prevented and an electron that is stored in the floating gate 30 is retained.

In this case, a voltage applied to the source 24 may be a positive power supply voltage or a negative power supply voltage (Don't Care).

[Control of Potential Barrier by Potential Control Gate 28]

Hereunder, control of a potential barrier within the tunnel oxide film 360 by the potential control gate 28 is described further.

Figure 4B:
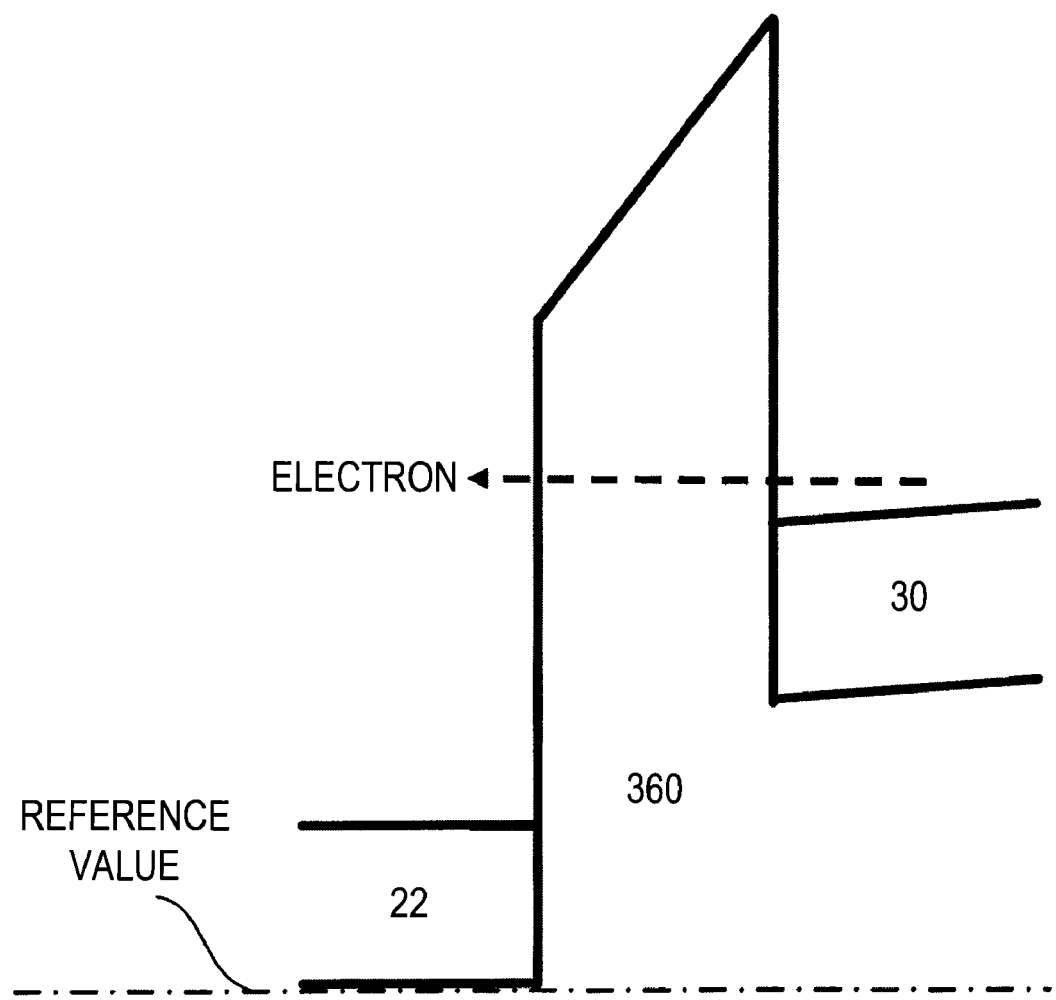
FIG. 4B is a potential diagram that explains changes in a potential barrier for an electron of each component part of a memory cell in a case where there is no potential control gate with respect to a memory cell of the memory circuit shown in FIG. 2 and FIG. 3, which is a potential diagram in a case of removing an electron that is stored in a floating gate to erase data.
Figure 4C:
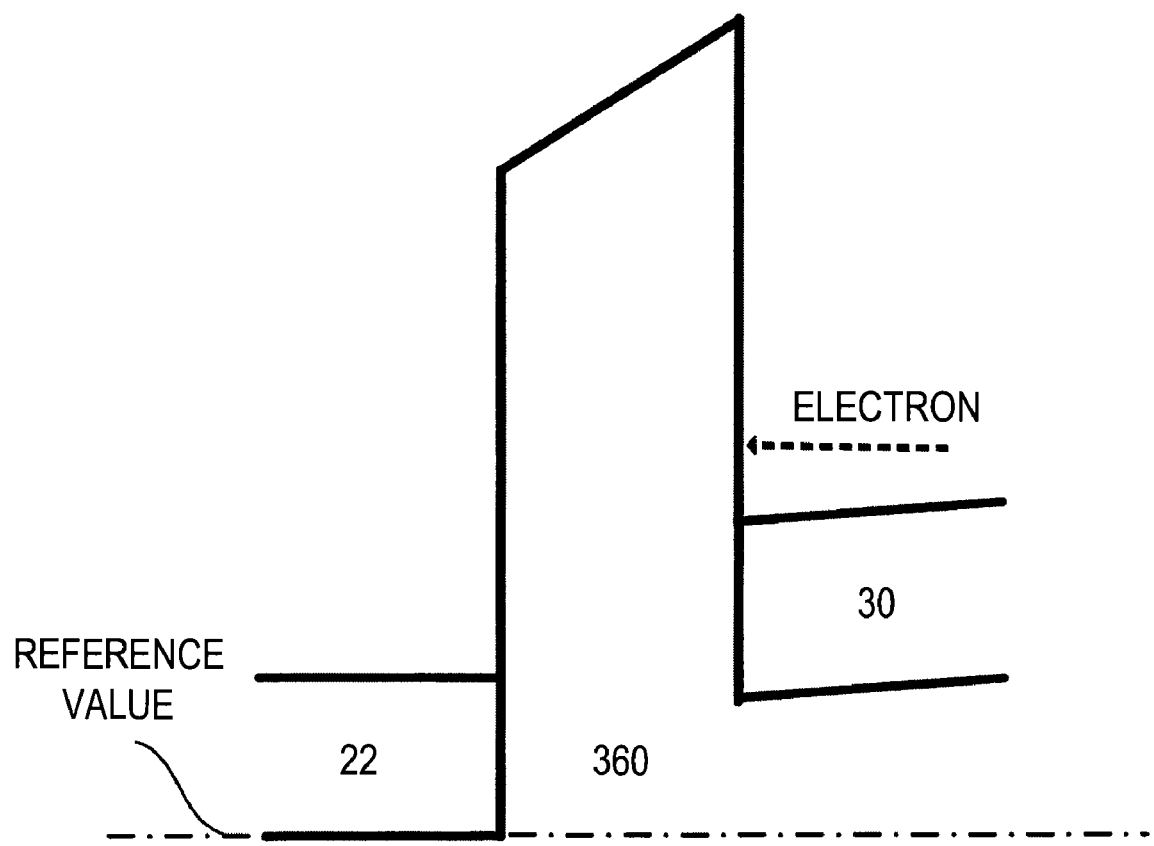
FIG. 4C is a potential diagram that explains changes in a potential barrier for an electron of each component part of a memory cell in a case where there is no potential control gate with respect to a memory cell of the memory circuit shown in FIG. 2 and FIG. 3, which is a potential diagram in a case of retaining an electron that is stored in a floating gate.

FIG. 4A to FIG. 4C are potential diagrams that describe changes in a potential barrier for an electron of respective component parts of the memory cell 200 in a case where there is no potential control gate 28, with respect to the memory cell 200 of the memory circuit 2 shown in FIG. 2 and FIG. 3. FIG. 4A shows a potential diagram in a case of storing an electron in the floating gate 30 to write data. FIG. 4B shows a potential diagram in a case of removing an electron stored in the floating gate 30 to erase data. FIG. 4C shows a potential diagram in a case of retaining an electron stored in the floating gate 30.

FIG. 5A to FIG. 5C are views that explain control of a potential barrier inside the tunnel oxide film 360 and the floating gate 30 for an electron that is produced by the potential control gate 28, with respect to the memory cell 200 of the memory circuit 2 shown in FIG. 2 and FIG. 3. FIG. 5A shows a potential diagram in a case of storing an electron in the floating gate 30 to write data. FIG. 5B shows a potential diagram in a case of removing an electron stored in the floating gate 30 to erase data. FIG. 5C shows a potential diagram in a case of retaining an electron stored in the floating gate 30.

In FIG. 4A to FIG. 4C and FIG. 5A to FIG. 5C, a reference value for comparing potential barriers among the respective figures is described.

As shown in FIG. 4A, when the potential control gate 28 is not formed in the memory cell 200, by applying a positive power supply voltage to the R/W control gate 32 (not shown in FIG. 4A to FIG. 4C and FIG. 5A to FIG. 5C), a potential barrier of the floating gate 30 and the tunnel oxide film 360 becomes lower than in the case of retaining an electron in the floating gate 30 as shown in FIG. 4C, and the potential barrier of the tunnel oxide film 360 changes to a state that allows an electron to pass through easily.

Thus, it becomes easy for an electron to pass through the tunnel oxide film 360 to the floating gate 30 from the channel 22 (substrate), and an electron supplied to the channel 22 passes through the tunnel oxide film 360 and is stored in the floating gate 30 to thereby write data.

Further, when a negative voltage is applied to the R/W control gate 32 and a positive power supply voltage is applied to the channel 22, as shown in FIG. 4B, the potential barrier of the floating gate 30 decreases more than in a case in which an electron is stored in the floating gate 30 as shown in FIG. 4C.

Accordingly, it becomes easy for an electron to pass in the direction from the floating gate 30 to the channel 22, and an electron stored in the floating gate 30 moves to the channel 22 to thereby erase data.

Furthermore, as shown in FIG. 4C, by applying a positive power supply voltage to the R/W control gate 32, a potential barrier for an electron of the floating gate 30 and the tunnel oxide film 360 becomes higher than in the case of storing an electron as shown in FIG. 4A, and the state changes to one that does not allow passage of an electron.

Thus, an electron that is stored in the floating gate 30 is retained.

In contrast, as shown in FIG. 5A, when the potential control gate 28 is formed in the memory cell 200, by application of a positive power supply voltage to the R/W control gate 32 and application of a positive voltage to the potential control gate 28, the potential barrier of the floating gate 30 and the tunnel oxide film 360 becomes lower compared to the case shown in FIG. 4A, and the state changes to one in which it is even easier for an electron to pass through.

Thus, it becomes even easier for an electron from the channel 22 to pass through the tunnel oxide film 360 (first tunnel oxide film 362 and second tunnel oxide film 364) to the floating gate 30. Hence, as illustrated by the dashed lines in FIG. 5A, an electron supplied to the channel 22 passes through the tunnel oxide film 360 and is stored in the floating gate 30 more quickly than in the case shown in FIG. 4A.

Further, as shown in FIG. 5B, when a negative voltage is applied to the R/W control gate 32, a positive voltage (positive power supply voltage) is applied to the potential control gate 28, and a positive power supply voltage is applied to the channel 22, the potential barrier of the floating gate 30 decreases more than in the case shown in FIG. 4B.

That is, the potential barrier of the first tunnel oxide film 362 and the second tunnel oxide film 364 enters a state that allows an electron to pass through more easily than in the case shown in FIG. 4B.

Accordingly, in this case, it is easier for an electron to pass in the direction from the floating gate 30 to the channel 22 compared to the case shown in FIG. 4B, and thus an electron stored in the floating gate 30 moves to the channel 22 and data is erased rapidly.

Further, as illustrated by the solid lines in FIG. 5C, by applying a negative power supply voltage to the R/W control gate 32 and applying a negative power supply voltage to the potential control gate 28, a potential barrier for an electron of the first tunnel oxide film 362 and the second tunnel oxide film 364 becomes higher compared to the case shown in FIG. 4C, as shown by the dashed lines in FIG. 5C. Thus, the potential barrier of the tunnel oxide film 360 changes to a state that prevents passage of an electron to an even greater degree.

Thus, since use of the potential control gate 28 enables reliable retention of an electron in the floating gate 30, a data retention time increases further.

[Method of Manufacturing Memory Cell 200]

Hereunder, a method of manufacturing the memory cell 200 shown in FIG. 2 is explained.

FIG. 6A to FIG. 6D are a first to fourth view that illustrate a method of manufacturing the memory cell 200 shown in FIG. 2 and FIG. 3 and the like. In FIG. 6A to FIG. 6D, views (A) to (K) illustrate a first to eleventh stage of a process to manufacture the memory cell 200.

Figure 6B:
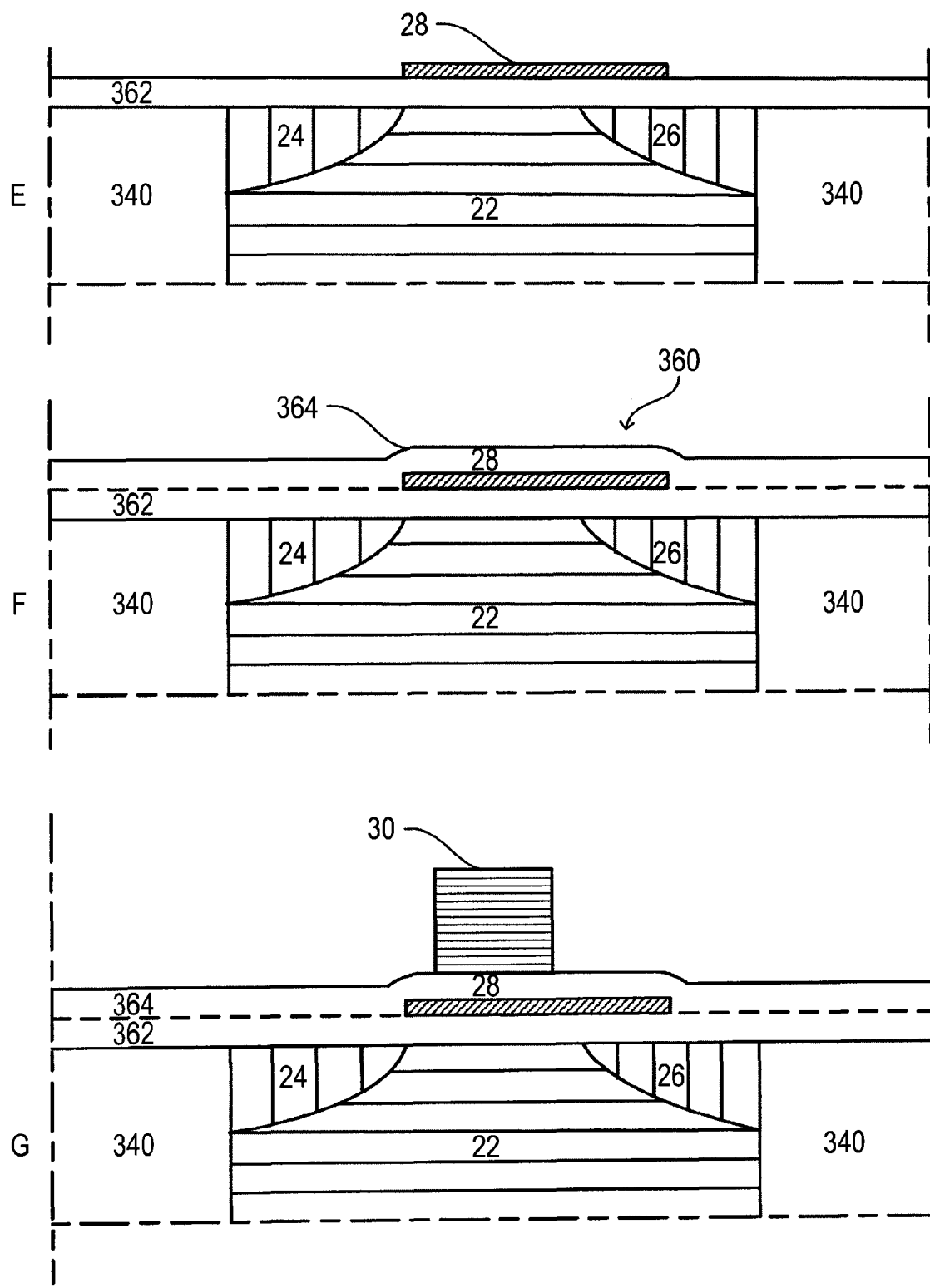
FIG. 6B is a second view that illustrates a method of manufacturing a memory cell shown in FIG. 2 and FIG. 3 and the like, in which reference characters (E) to (G) denote a fifth to seventh stage of a memory cell manufacturing process.
Figure 6D:
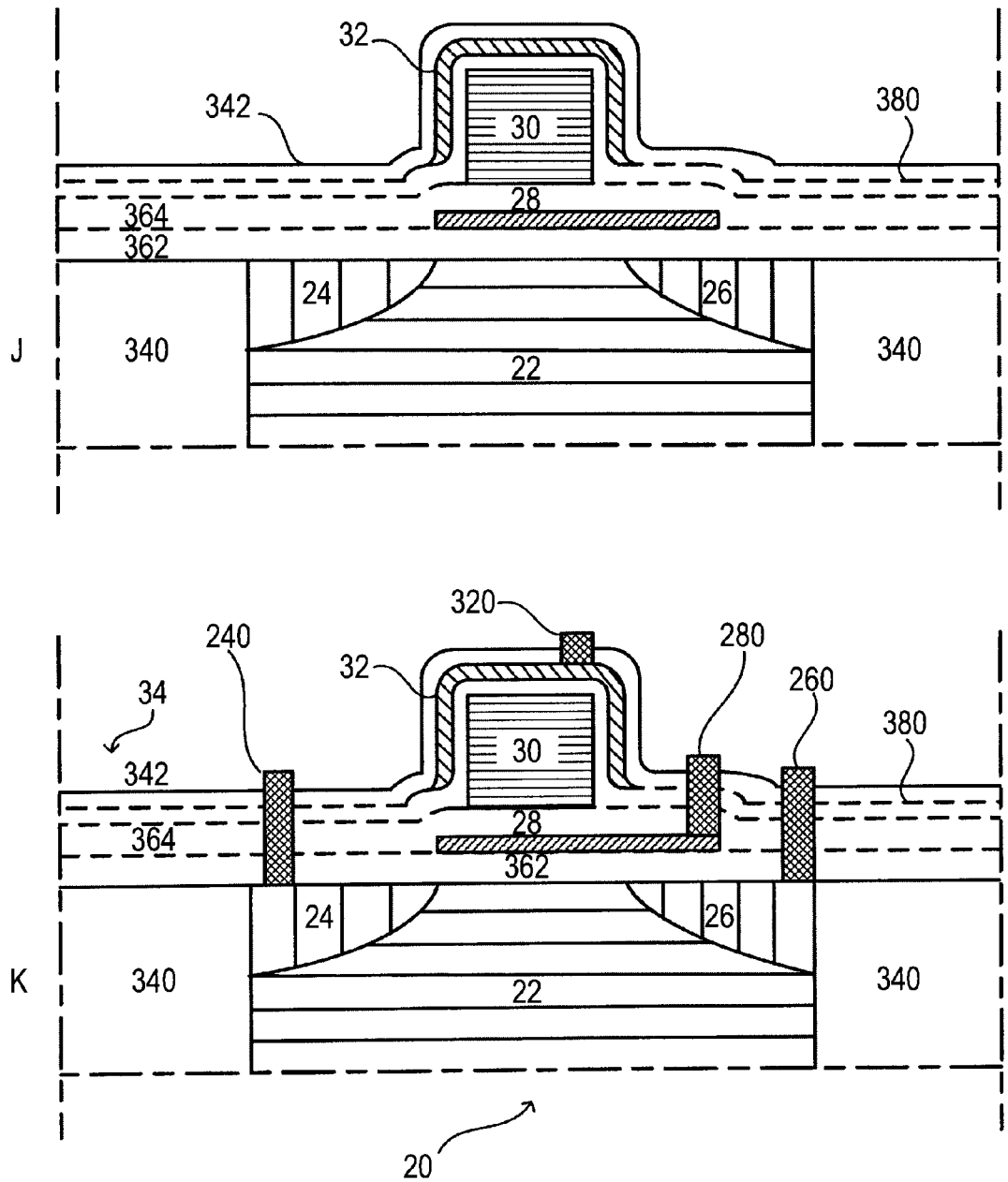
FIG. 6D is a fourth view that illustrates a method of manufacturing a memory cell shown in FIG. 2 and FIG. 3 and the like, in which reference characters (J) and (K) denote a tenth and eleventh stage of a memory cell manufacturing process.

FIG. 6D (K) is substantially the same as FIG. 3.

The manufacturing process illustrated in FIG. 6A to FIG. 6D is for illustrative purposes and represents a typical process, and a wiring method that connects each gate and electrode with a signal wire, the positional relation/size relation between component parts, and parameters such as the material/shape/thickness and the like of each gate and the like can be suitably changed in accordance with the configuration of the EEPROM 10 and performance requirements thereof and the like.

It will be apparent to those skilled in the art that the method of manufacturing the memory cell 200 illustrated in FIG. 6A to FIG. 6D can be practiced by suitably using known semiconductor manufacturing techniques including pattern formation using photoresist, diffusion of material, sputtering, metal deposition, formation of an insulating layer by silicon dioxide, and the like, respectively.

As shown in FIG. 6A (A), the memory cell 200 is formed on a p-type semiconductor substrate.

First, as shown in FIG. 6A (B), the inter-element isolation regions 340 are formed that electrically insulate an area between adjacent memory circuits 2 formed by silicon dioxide or between the memory circuit 2 and another element used in the circuit block such as the input/output control circuit 106.

Next, as shown in FIG. 6A (C), n-type semiconductor regions are formed at both ends of the p-type semiconductor channel 22 of the transistor 20. These regions are employed as the source 24 and the drain 26.

Subsequently, as shown in FIG. 6A (D), a first tunnel oxide film 362 is formed on the transistor 20 and the inter-element isolation regions 340.

Further, as shown in FIG. 6B (E), the potential control gate 28 is formed by silicon on the surface of the first tunnel oxide film 362 so as to face the channel 22.

Next, as shown in FIG. 6B (F), the second tunnel oxide film 364 is formed on the surface of the first tunnel oxide film 362 and the potential control gate 28 so as to cover the first tunnel oxide film 362 and the potential control gate 28.

Subsequently, as shown in FIG. 6B (G), the floating gate 30 is formed by polysilicon on the surface of the tunnel oxide film 360 so as to face the channel 22 and the potential control gate 28.

The tunnel oxide film 360 includes the first tunnel oxide film 362 and the second tunnel oxide film 364, and the thickness thereof is equal to the sum of the thicknesses of the first tunnel oxide film 362 and the second tunnel oxide film 364.

For example, according to the current technology, the thickness of the tunnel oxide film 360 is around 1.5 to 3 nm, and the width thereof is made the same as the width of the floating gate 30.

Further, as shown in FIG. 6C (H), the R/W control gate oxide film 380 is formed on the surface of the floating gate 30 and the second tunnel oxide film 364 so as to cover the floating gate 30 and the second tunnel oxide film 364.

Next, as shown in FIG. 6C (I), the R/W control gate 32 is formed so as to cover the floating gate 30 via the R/W control gate oxide film 380.

Subsequently, as shown in FIG. 6D (J), the oxide film 342 is formed so as to cover the R/W control gate 32 and the like.

Further, as shown in FIG. 6D (K), source wiring 240 between the source 24 and the word line 110, drain wiring 260 between the drain 26 and the negative power supply, potential control gate wiring 280 between the potential control gate 28 and the potential control wire 108, and control gate wiring 320 between the R/W control gate 32 and the potential control wire 108 are formed in sequence.

In this connection, for the purpose of wiring convenience, an oxide film can be formed as appropriate between the wirings shown in FIG. 6D (K).

Modification Example

Hereunder, a modification example of the present embodiment is described.

Although a specific example is described above in which the EEPROM 10 is formed on the p-type semiconductor channel 22 and a positive voltage or a negative power supply voltage is applied to the potential control gate 28 and the floating gate 30, the EEPROM 10 can also be formed on an n-type semiconductor channel.

In this case, the channel of the memory cell is n-type, the source is p-type, and the drain is p-type, and the memory cell is connected to a positive power supply.

Further, in this case, when storing data in the floating gate 30, a negative power supply voltage is applied to the R/W control gate 32, a negative voltage (for example, negative power supply voltage) is applied to the potential control gate 28, and a positive hole is retained in the floating gate 30.

Furthermore, in this case, when retaining data in the floating gate 30, a positive power supply voltage is applied to the potential control gate 28.

More specifically, when an n-type channel is used instead of the p-type channel 22 in a memory cell, the kind of semiconductor constituting the memory cell 200, the polarity of a power supply, the polarity of a voltage applied at the time of operation, and the polarity of a charge are opposite to the case in which the p-type channel 22 is used.

Although in the above example the voltage of a potential control signal applied to the R/W control gate 32 when writing data in the EEPROM 10 is a positive power supply voltage, this voltage can be suitably changed in accordance with the structure of the memory cell 200 and the like.

In this case, it is sufficient to modify the EEPROM 10 by providing, separately to the positive power supply voltage, a circuit that generates this positive voltage in the input/output control circuit 106, so as to apply a positive voltage generated by the circuit to the write control gate 32 of a memory circuit 2 selected by the word line 110 and the bit line 112 when writing data.

Second Embodiment

Figure 7:
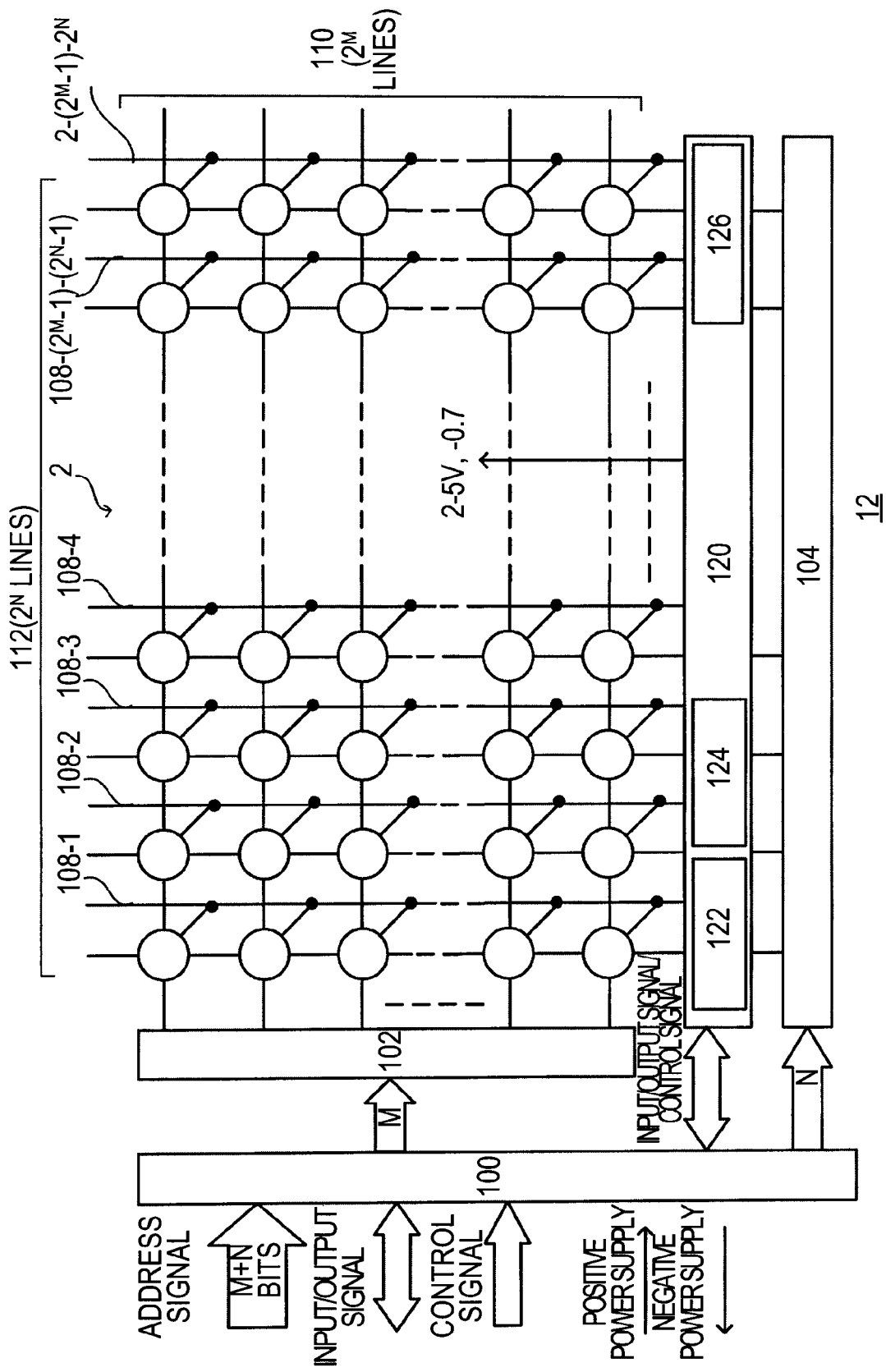
FIG. 7 is a view that illustrates the configuration of a second EEPROM that is explained as a second embodiment of the semiconductor storage device according to this application.

FIG. 7 is a view that shows the configuration of a second EEPROM 12 that is explained as a second embodiment of the semiconductor storage device according to this application.

As shown in FIG. 7, the second EEPROM 12 has a configuration in which, relative to the configuration of the first EEPROM 10, the input/output control circuit 106 of the first EEPROM 10 is, for example, replaced with a second input/output control circuit 120 including a negative voltage generation circuit 126 that generates an alternating current signal to generate a negative voltage.

In the EEPROM 12, when a potential control signal of a voltage (for example, a voltage of about −0.7 V that is lower than ground voltage (0 V)) that is lower than the negative power supply voltage generated by the negative voltage generation circuit 126 is applied to the potential control gate 28 of the memory cell 200 while an electron is retained in the floating gate 30, a potential barrier for an electron at the tunnel oxide film 360 increases in comparison to a case in which a negative power supply voltage is applied to the potential control gate 28, and thus the data retention time increases further.

In this connection, in the EEPROM 12, it is necessary to suitably change the operations of the voltage application circuit 202 (FIG. 2) in accordance with application of a negative voltage at a time of data retention.

Third Embodiment

FIG. 8 is a view that illustrates the configuration of a third EEPROM 14 that is explained as a third embodiment of the semiconductor storage device according to this application.

The third EEPROM 14 has a configuration in which, relative to the configuration of the first EEPROM 10, the row decoder 102 of the first EEPROM 10 is replaced with a second row decoder 142 that generates a potential control signal in accordance with a control signal input from a bus, and the first input/output interface circuit 100 of the first EEPROM 10 is replaced with a second input/output interface circuit 140 that outputs a control signal to the second row decoder 142.

In the EEPROM 14, when data writing is being performed to the memory cell 200, in accordance with a control signal from the bus, the row decoder 142 applies a potential control signal of a positive voltage only to the potential control gate 28 of memory cells 200 connected to word lines selected by M address signals, and applies a potential control signal of a negative power supply voltage to other memory cells 200.

Fourth Embodiment

FIG. 9 is a view that illustrates the configuration of a second memory cell 400 that is explained as a fourth embodiment of the semiconductor storage device according to this application.

Differences between the first memory cell 200 shown in FIG. 3 and the second memory cell 400 shown in FIG. 9 are as described in (1) to (4) below.

(1) In the second memory cell 400, the first transistor 20 of the first memory cell 200 is replaced with a second transistor 40 composed by a channel 42, a source 44, and a drain 46 that are of a different shape to the channel 22, the source 24, and the drain 26, respectively.

(2) In the second memory cell 400, the first potential control gate 28 is replaced with a second potential control gate 48 that has a shorter shape in the direction of the channel 42.

(3) The second tunnel oxide film 364 of the oxide film 34, the R/W control gate oxide film 380 and the oxide film 342, and the R/W control gate 32 of the first memory cell 200 are replaced in the second memory cell 400 by a third tunnel oxide film 564 of an oxide film 54 whose shape is changed in accordance with the shape of the second potential control gate 48, a second R/W control gate oxide film 580 and an oxide film 542, and an R/W control gate 52.

(4) The wiring 240 of the source 24, the wiring 260 of the drain 26, and the wiring 280 of the potential control gate 28 in the first memory cell 200 are replaced in the second memory cell 400 by wiring 440 of the source 44, wiring 460 of the drain 46, and wiring 480 of the potential control gate 48.

As described above, the memory cell 400 that has a different structure to the memory cell 200 is also included as a technical idea in the same scope as the memory cell 200.

The second memory cell 400 shown in FIG. 9 can be used instead of the first memory cell 200 in the memory circuit 2 of the EEPROMs 10, 12, and 14 shown in FIG. 1, FIG. 7, and FIG. 8.

In the second memory cell 400, the channel 42 and a floating gate 50 are facing without the potential control gate 48 therebetween, and at the time of writing data an electron from the source 44 is stored in the floating gate 50.

Therefore, although it is necessary according to the first memory cell 200 for the potential control gate 28 to be placed in a floating state when reading out data, according to the memory cell 400 data can be read out while in a state in which a negative voltage for data retention is applied to the potential control gate 48, and without the potential control gate 48 being in a floating state.

The above described embodiments have been presented for purposes of illustration and description, and are not intended to encompass all embodiments of the disclosure relating to the claims of this application.

Further, the above described embodiments are not intended to limit the technical scope of the disclosure relating to the claims of this application to the precise embodiments disclosed, and naturally many modifications and variations are possible in light of the above teaching.

Furthermore, the above described embodiments were chosen and described in order to best explain the principles of the disclosure relating to the claims of this application and the practical application thereof, to thereby enable others skilled in the art, based on the precise embodiments described above, to add and utilize various modifications in order to optimize the disclosure relating to the claims of this application and the practical application thereof for all actual uses contemplated.

It is intended that the technical scope of the disclosure relating to the claims of this application be defined by the description and the equivalents thereof.

INDUSTRIAL APPLICABILITY

The disclosure of the claims of this application can be utilized for a semiconductor storage device and the manufacture thereof.

DESCRIPTION OF SYMBOLS 10, 12, 14 . . . EEPROM,
100, 140 . . . input/output interface circuit,
122 . . . signal readout circuit,
124 . . . potential control circuit,
126 . . . negative voltage generation circuit,
102, 142 . . . row decoder,
104 . . . column decoder,
106, 120, 146 . . . input/output control circuit,
108, 144 . . . potential control wire,
110 . . . word line,
112 . . . bit line,
2, 62, 64 . . . memory circuit,
202 . . . voltage application circuit, 200, 400 . . . memory cell,
20, 40 . . . transistor,
22 . . . channel,
24, 44 . . . source,
26, 46 . . . drain,
28, 48 . . . potential control gate,
30, 50 . . . floating gate,
32, 52 . . . read/write (R/W) control gate,
34, 54 . . . oxide film layer,
342, 542 . . . oxide film,
36 . . . tunnel oxide film,
362 . . . first tunnel oxide film,
364, 564 . . . second tunnel oxide film,
380, 580 . . . R/W control gate oxide film,
240, 260, 280, 320, 440, 460, 480, 520 . . . wiring

The invention claimed is:

1. A semiconductor storage device that operates by being connected to a positive power supply and a negative power supply, comprising:
a plurality of memory cells each comprising:
a p-type semiconductor channel,
a first n-type region formed in the channel,
a second n-type region formed in the channel,
a first insulator formed on a surface of the channel,
a first control gate formed by a n-type semiconductor formed on a surface of the first insulator,
a second insulator formed on a surface of the first control gate,
a floating gate formed on a surface of the second insulator and to stores data according to whether or not electrons being stored therein,
a third insulator formed on a surface of the floating gate, and
a second control gate formed on a surface of the third insulator; and
a control circuit that:
applies a predetermined positive voltage to the first control gate and applies a positive voltage to the second control gate to control a potential barrier between the channel and the floating gate so as to facilitate passage of electrons therethrough in order to store data in each of the plurality of memory cells for each of the plurality of memory cells;
applies a ground voltage to the first control gate to control the potential barrier between the channel and the floating gate so as to have the passage of electrons therethrough be difficult in order to retain data in each of the plurality of memory cells for each of the plurality of memory cells; and
places the first control gate in a floating state in which the first control gate is electrically isolated from all other components in order to read out data from each of the plurality of memory cells when a positive voltage is applied to the first n-type region for each of the plurality of memory cells;
wherein the first insulator and the second insulator have the floating gate store electrons to store data only when a positive voltage being applied to the first n-type region in each of the plurality of memory cells.

2. A semiconductor storage device comprising:
a plurality of memory cells each comprising:
a semiconductor channel of a predetermined polarity;
a first region formed by a semiconductor of an opposite polarity to the channel;
a second region formed by a semiconductor of an opposite polarity to the channel;
a first control gate;
a first insulator formed between the channel and the first control gate;
a floating gate;
a second insulator formed between the first control gate and the floating gate;
a second control gate; and
a third insulator formed between the floating gate and the second control gate, and
a control circuit for controlling each of the plurality of memory cells so as to:
apply a write voltage of a voltage determined according to a polarity of the channel to the second control gate and apply a first potential control voltage to the first control gate of each of the plurality of memory cells so that a potential barrier at the first insulator and the second insulator facilitates passage of a charge therethrough so as to have the floating gate store the charge; and
apply a second potential control voltage of a predetermined voltage to the first control gate of each of the plurality of memory cells to retain a state in which the floating gate stores the charge or not.

3. The semiconductor storage device according to claim 2, wherein:
the channel is a p-type semiconductor; and
the first region and the second region are n-type semiconductors.

4. The semiconductor storage device according to claim 3, wherein:
when retaining a state in which the floating gate stores the charge or not, the control circuit applies the second potential control voltage of a ground voltage to the first control gate; and
the first control gate is formed by an n-type semiconductor and, when the second potential control voltage of a ground voltage is applied to retain the potential barrier in a state in which passage of a negative charge therethough becomes difficult.

5. The semiconductor storage device according to claim 2, wherein:
the channel is an n-type semiconductor; and
the first region and the second region are p-type semiconductors.

6. The semiconductor storage device according to claim 5, wherein:
when retaining a state in which the floating gate stores the charge or not, the control circuit applies the second potential control voltage of a ground voltage to the first control gate; and
the first control gate is formed by a p-type semiconductor and, when the second potential control voltage of a ground voltage is applied, retains the potential barrier in a state in which passage of a positive charge therethrough becomes difficult.

7. The semiconductor storage device according to claim 2, wherein the control circuit:
applies a voltage to the second control gate and the first region to determine whether or not the floating gate stores the charge or not according to whether an electric current flows in the channel; and
places the first control gate in a floating state in which the first control gate is electrically isolated from all other components at the determination whether or not the floating gate stores the charge.

8. The semiconductor storage device according to claim 4, wherein:
the first control gate is formed in a shape to have a part of a surface of the floating gate facing the channel face the channel via the first insulator or via at least one part of the first insulator and the second insulator; and
the control circuit:
applies a voltage to the second control gate and the first region, and determines whether or not the floating gate stores the charge according to whether or not an electric current flows in the channel; and
maintains the first control gate at a voltage for retaining the charge in the floating gate at the determination whether or not the floating gate stores the charge.

9. A semiconductor device manufacture method for manufacturing a semiconductor device including a plurality of memory cells, comprising the steps of:
with respect to each of the plurality of memory cells,
forming a semiconductor channel of a predetermined polarity;
forming a first insulator on a surface of the channel;
forming a first control gate on a surface of the first insulator;
forming a second insulator on a surface of the first control gate;
forming a floating gate in contact with the second insulator;
forming a third insulator on a surface of the floating gate;
forming a second control gate on a surface of the third insulator; and
forming wiring for applying voltages of a predetermined plurality of values to the first control gate and the second control gate;
forming each of the plurality of memory cells; and
forming a control circuit that controls each of the plurality of memory cells, so as to:
apply a write voltage of a voltage determined according to a polarity of the channel to the second control gate, and apply a first potential control voltage to the first control gate through the wiring so as to have a potential barrier at the first insulator and the second insulator facilitate passage of a charge therethrough to store the charge in the floating gate; and
apply a second potential control voltage of a ground voltage or a predetermined voltage to the first control gate of each of the plurality of memory cells through the wiring to retain a state in which the floating gate storing a stores the charge or not.

10. The semiconductor device manufacture method according to claim 9, wherein the first control gate is formed in a shape to have a part of a surface of the floating gate that face the channel to face the channel via the first insulator or via at least one part of the first insulator and the second insulator.

11. The semiconductor device manufacture method according to claim 9, wherein:
the channel is formed with a p-type semiconductor; and
when forming the first control gate, the first control gate is formed by an n-type semiconductor on a surface of the first insulator.

12. A semiconductor memory cell comprising:
a semiconductor channel of a predetermined polarity;
a first insulator formed on a surface of the channel;
a first control gate formed on a surface of the first insulator;
a second insulator formed on a surface of the first control gate;
a floating gate formed in contact with the second insulator;
a third insulator formed on a surface of the floating gate;
a second control gate formed on a surface of the third insulator; and
wiring for applying voltages of a predetermined plurality of values to the first control gate and the second control gate,
wherein, via the wiring,
a write voltage of a voltage determined according to a polarity of the channel is applied to the second control gate, first potential control voltage is applied to the first control gate so as to have a potential barrier at the first insulator and the second insulator facilitate passage of a charge therethrough to have the floating gate store the charge, and
a second potential control voltage of a ground voltage or a predetermined voltage is applied to the first control gate of each of the plurality of memory cells via the wiring so that a state in which the floating gate stores the charge or not is retained.

* * * * *

UNITED STATES PATENT AND TRADEMARK OFFICE
CERTIFICATE OF CORRECTION

| | | |
|---|---|---|
| PATENT NO. | : 7,907,451 B2 | Page 1 of 1 |
| APPLICATION NO. | : 12/665320 | |
| DATED | : March 15, 2011 | |
| INVENTOR(S) | : Iwasaki | |

It is certified that error appears in the above-identified patent and that said Letters Patent is hereby corrected as shown below:

In Column 1, Line 43, delete "Al203" and insert -- $Al_2O_3$ --, therefor.

In Column 1, Line 48, delete "SiO2/Si" and insert -- $SiO_2$/Si --, therefor.

In Column 1, Line 57, delete "IEEE" and insert -- IEEE. --, therefor.

In Column 17, Line 14, delete "film," and insert -- film, and --, therefor.

In Column 17, Line 15, delete "wiring" and insert -- wiring. --, therefor.

In Column 17, Line 47, in Claim 1, delete "therethough" and insert -- therethrough --, therefor.

In Column 18, Line 39, in Claim 4, delete "therethough" and insert -- therethrough --, therefor.

In Column 20, Line 5, in Claim 9, after "floating gate" delete "storing a".

Signed and Sealed this
First Day of May, 2012

David J. Kappos
*Director of the United States Patent and Trademark Office*